(12) United States Patent
Miyamoto et al.

(10) Patent No.: US 9,755,036 B2
(45) Date of Patent: Sep. 5, 2017

(54) SEMICONDUCTOR DEVICE, DISPLAY DEVICE, AND METHOD FOR PRODUCING SEMICONDUCTOR DEVICE

(71) Applicant: Sharp Kabushiki Kaisha, Osaka (JP)

(72) Inventors: Tadayoshi Miyamoto, Osaka (JP); Kazuhide Tomiyasu, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 15/021,776

(22) PCT Filed: Aug. 12, 2014

(86) PCT No.: PCT/JP2014/071257
§ 371 (c)(1),
(2) Date: Mar. 14, 2016

(87) PCT Pub. No.: WO2015/040982
PCT Pub. Date: Mar. 26, 2015

(65) Prior Publication Data
US 2016/0233309 A1    Aug. 11, 2016

(30) Foreign Application Priority Data
Sep. 18, 2013   (JP) ................................. 2013-193221

(51) Int. Cl.
*H01L 29/10*   (2006.01)
*H01L 29/45*   (2006.01)
(Continued)

(52) U.S. Cl.
CPC .......... *H01L 29/45* (2013.01); *H01L 27/1225* (2013.01); *H01L 29/41733* (2013.01);
(Continued)

(58) Field of Classification Search
CPC ............... H01L 29/45; H01L 29/41733; H01L 29/66742; H01L 29/66969;
(Continued)

(56) References Cited

U.S. PATENT DOCUMENTS

2008/0258141 A1* 10/2008 Park ................... H01L 29/78618
257/43
2010/0099216 A1   4/2010 Suzawa et al.
(Continued)

FOREIGN PATENT DOCUMENTS

JP        9-331066 A     12/1997
JP      H11-258625 A      9/1999
(Continued)

*Primary Examiner* — Tu-Tu Ho
(74) *Attorney, Agent, or Firm* — Chen Yoshimura LLP

(57) ABSTRACT

This semiconductor device includes a substrate and a thin film transistor supported on the substrate. The thin film transistor includes a gate electrode, a semiconductor layer, a gate-insulating layer provided between the gate electrode and the semiconductor layer, and a source electrode and a drain electrode respectively making contact with the semiconductor layer. The source electrode and the drain electrode respectively include a main layer containing aluminum or copper, a lower layer having a first layer containing refractory metal and positioned at a substrate side of the main layer, and an upper layer having a second layer containing refractory metal. The upper layer is provided so as to cover an upper surface of the main layer and at least the section of the side face of the main layer that overlaps the semiconductor layer.

14 Claims, 12 Drawing Sheets

(51) Int. Cl.
*H01L 29/417* (2006.01)
*H01L 29/786* (2006.01)
*H01L 27/12* (2006.01)
*H01L 29/66* (2006.01)

(52) U.S. Cl.
CPC .. *H01L 29/66742* (2013.01); *H01L 29/66969* (2013.01); *H01L 29/7869* (2013.01); *H01L 29/78651* (2013.01)

(58) Field of Classification Search
CPC ........... H01L 29/78651; H01L 29/7869; H01L 27/1225; H01L 27/124
USPC .......................................................... 257/43
See application file for complete search history.

(56) References Cited

U.S. PATENT DOCUMENTS

| | | |
|---|---|---|
| 2010/0127266 A1 | 5/2010 | Saito et al. |
| 2010/0193783 A1 | 8/2010 | Yamazaki et al. |
| 2011/0062436 A1* | 3/2011 | Yamazaki ........... H01L 27/1225 257/43 |
| 2014/0183529 A1* | 7/2014 | Yamazaki ........... H01L 29/7869 257/43 |

FOREIGN PATENT DOCUMENTS

| | | |
|---|---|---|
| JP | 2002-111004 A | 4/2002 |
| JP | 2010-123748 A | 6/2010 |
| JP | 2010-123923 A | 6/2010 |
| JP | 2010-199566 A | 9/2010 |
| JP | 2011-86923 A | 4/2011 |

* cited by examiner (a)

(b)

(a)

(b)

(a)

(b)

(c)

(d)

(e)

SEMICONDUCTOR DEVICE, DISPLAY DEVICE, AND METHOD FOR PRODUCING SEMICONDUCTOR DEVICE

TECHNICAL FIELD

The present invention relates to a semiconductor device and a method of manufacturing the semiconductor device, particularly to a semiconductor device that includes thin film transistors (TFTs) and the method of manufacturing the device. Also, the present invention relates to a display device including the semiconductor device.

BACKGROUND ART

In recent years, display devices that include active matrix substrates have become widely used. The active matrix substrate includes, for each pixel, a switching element such as a thin film transistor (referred to as a TFT below). An active matrix substrate including TFTs as switching elements is referred to as a TFT substrate.

A TFT substrate used in a liquid crystal display device or the like includes a glass substrate, a plurality of TFTs supported by the glass substrate, gate wiring, source wiring, and pixel electrodes arranged in a matrix, for example. A gate electrode, a source electrode, and a drain electrode in each of the TFTs are electrically connected to the gate wiring, the source wiring, and the pixel electrode, respectively. The TFT, the source wiring, and the gate wiring are normally covered by an interlayer insulating layer, and the pixel electrode is provided on the interlayer insulating layer and connected to the drain electrode of the TFT inside a contact hole formed in the interlayer insulating layer.

Conventionally, TFTs having an amorphous silicon film as the active layer (hereafter "amorphous silicon TFTs") or TFTs having a polycrystalline film as the active layer (hereinafter "polycrystalline silicon TFTs") are widely used. Recently, oxide semiconductors have been given attention as a material for the active layer of TFTs. The oxide semiconductors have a higher mobility than amorphous silicon. Therefore, the oxide semiconductor TFTs can operate at a faster speed than the amorphous silicon TFTs. Because an oxide semiconductor film can be formed by a simpler process than a polycrystalline silicon film, the oxide semiconductor film can be employed in a device requiring a large surface area. In the present specification, a TFT having an oxide semiconductor film as the active layer may be referred to as an "oxide semiconductor TFT."

The source electrode and the drain electrode of a TFT are generally formed from the same conductive film from which the source wiring is formed. Aluminum (Al) or an Al alloy having high conductivity is widely used for the material for the conductive film. Recently, using copper (Cu), which has even higher conductivity, has also been proposed. In the present specification, a layer formed from the same conductive film including the source wring may be referred to as the "source wiring layer."

By forming the source wiring layer using Al or the like described above, source wiring with small wiring resistance can be formed. On the other hand, when the Al film (or Al alloy film) makes contact with the semiconductor layer of the TFT, there is a concern that Al will diffuse into the semiconductor layer and that the desired TFT characteristics become unobtainable. Similarly, when forming a source wiring layer using Cu, there is a concern that Cu will diffuse into the semiconductor layer and that the desired TFT characteristics become unobtainable. Also, in a manufacturing process of a TFT substrate, when performing heat treatment (approximately 200 to 600° C., for example) after forming the source wiring layer, the surface of the Al layer can be modified because of the Al layer (or Al alloy layer) being heated, and a protrusion called a hillock can be generated. A hillock on the surface of the Al layer reduces the insulation characteristics of the interlayer insulating layer.

On the basis of these considerations, using a multilayer film to form a source wiring layer has been proposed. Patent Documents 1 and 2 disclose a source electrode and a drain electrode having a structure in which a molybdenum (Mo) layer, an Al layer, and a Mo layer are sequentially layered, for example. Patent Document 3 discloses a configuration in which a titanium (Ti) layer is formed between an Al layer and an oxide semiconductor layer or between a Cu layer and the oxide semiconductor layer. Patent Document 4 discloses a source electrode and a drain electrode having a structure in which a Ti layer, an Al layer, and a Ti layer are sequentially layered.

RELATED ART DOCUMENTS

Patent Documents

Patent Document 1: Japanese Patent Application Laid-Open Publication No. H11-258625
Patent Document 2: Japanese Patent Application Laid-Open Publication No. 2002-111004
Patent Document 3: Japanese Patent Application Laid-Open Publication No. 2010-123923
Patent Document 4: Japanese Patent Application Laid-Open Publication No. 2010-123748

SUMMARY OF THE INVENTION

Problems to be Solved by the Invention

Research by the inventors of the present application found that simply using a multilayer film for the conductive film for forming the source wiring layer in the manner similar to the technologies disclosed in Patent Documents 1 to 4 does not adequately suppress the diffusion of Al or Cu into the semiconductor layer. The diffusion of Al or Cu into the semiconductor layer lowers the reliability of the semiconductor device that includes TFTs.

In recent years, as the resolution of display devices becomes higher, and the screen size of display devices increases, there is a demand for ever lower wiring resistance. Generally, as the resolution becomes higher, and as the size of a display panel becomes larger, signal rounding of the wiring increases because wiring resistance and parasitic capacitance increase. To lower wiring resistance, either the wiring may be made thicker, or the wiring width may be made wider. To reduce wiring resistance while maintaining aperture ratio, the wiring needs to be made thicker.

However, there is a concern that making the wiring thicker can cause a disconnection in the interlayer insulating layer covering the TFTs due to the shape of the side face of the source electrode and the drain electrode becoming steep in a cross-section perpendicular to the substrate surface. When a disconnection occurs, the diffusion of Al or Cu is markedly accelerated by the moisture that enters through the disconnection.

The present invention is provided in view of the problems described above, and an aim of the invention is to improve the reliability of a semiconductor device that includes TFTs using a relatively simple configuration.

Means for Solving the Problems

A semiconductor device in one embodiment of the present invention includes: a substrate and a thin film transistor supported on the substrate, wherein the thin film transistor includes: a gate electrode; a semiconductor layer; a gate insulating layer between the gate electrode and the semiconductor layer; and a source electrode and a drain electrode each contacting the semiconductor layer, and wherein the source electrode and the drain electrode each include: a main layer including aluminum or copper; a lower layer underneath the main layer, having a first layer including a refractory metal; and an upper layer above the main layer, having a second layer including a refractory metal, and wherein the upper layer is provided so as to cover a top of the main layer and, among side faces of the main layer, at least a side face that is located at a position corresponding to the semiconductor layer.

In one embodiment, the source electrode and the drain electrode are each provided so as to contact a portion of an upper surface of the semiconductor layer.

In one embodiment, the source electrode and the drain electrode are each provided so as to contact a portion of a lower surface of the semiconductor layer.

A semiconductor device according to another embodiment of the present invention includes: a substrate and a thin film transistor supported on the substrate, wherein the thin film transistor includes: a gate electrode; a semiconductor layer; a gate insulating layer between the gate electrode and the semiconductor layer; and a source electrode and a drain electrode each contacting the semiconductor layer, wherein the source electrode and the drain electrode each contact a portion of a lower surface of the semiconductor layer, and wherein the source electrode and the drain electrode each include: a main layer including aluminum or copper; and an upper layer above the main layer, having a first layer including a refractory metal, wherein the upper layer is provided so as to cover a top of the main layer and, among side faces of the main layer, at least a side face that is located at a position corresponding to the semiconductor layer.

In one embodiment, the gate electrode is arranged closer to the substrate than the semiconductor layer.

In one embodiment, the semiconductor layer is arranged closer to the substrate than the gate electrode.

In one embodiment, the refractory metal is titanium, molybdenum, tungsten, tantalum, or chromium.

In one embodiment, the semiconductor layer includes an oxide semiconductor.

In one embodiment, the oxide semiconductor includes an In—Ga—Zn—O semiconductor.

In one embodiment, the In—Ga—Zn—O semiconductor includes crystalline parts.

In one embodiment, the thin film transistor further includes an etch stop layer that covers a channel region of the semiconductor layer.

In one embodiment, the semiconductor device is an active matrix substrate.

A display device according to one embodiment of the present invention is a display device that includes the above-mentioned semiconductor device.

A method of manufacturing a semiconductor device according to one embodiment of the present invention includes: preparing a substrate; and forming a thin film transistor on the substrate, the thin film transistor including a semiconductor layer, a gate electrode, a source electrode, a drain electrode, and a gate-insulating layer, wherein the step of forming the thin film transistor includes forming the source electrode and the drain electrode which each include a main layer including aluminum or copper and an upper layer above the main layer, having a first layer including a refractory metal, and wherein, in the step of forming the source electrode and the drain electrode, the upper layer is formed so as to cover a top of the main layer and, among side faces of the main layer, at least a side face that is located at a position corresponding to the semiconductor layer.

In one embodiment, the step of forming the source electrode and the drain electrode includes forming an upper conductive film having the first layer including the refractory metal on the main layer and thereafter patterning the upper conductive film so as to form the upper layer.

In one embodiment, the step of forming the source electrode and the drain electrode further includes sequentially forming a lower conductive film having a second layer including a refractory metal and a middle conductive film including aluminum or copper and thereafter patterning the lower conductive film and the middle conductive film so as to form a lower layer and the main layer, the lower layer being underneath the main layer, having the second layer including the refractory metal.

Effects of the Invention

According to embodiments of the present invention, the reliability of a semiconductor device that includes TFTs can be improved using a relatively simple configuration.

DETAILED DESCRIPTION OF EMBODIMENTS

With reference to figures, a semiconductor device, a display device, and a method of manufacturing the same according to embodiments of the present invention will be described below. However, the present invention is not limited by these embodiments, which are examples. A semiconductor device according embodiments of the present invention may have at least one TFT, and various types of substrates, display devices, or electronic devices may have this TFT. Below, a TFT substrate (active matrix substrate) for a display device (liquid crystal display device, for example) is used as an example for description.

Figure 1:
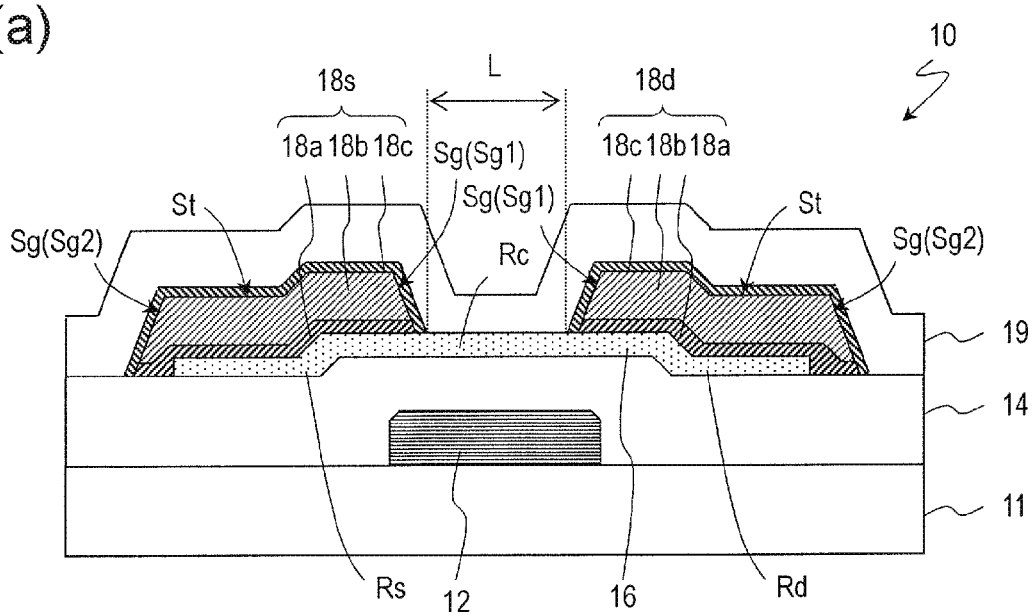
FIG. 1(a) is a schematic cross-sectional view of a thin film transistor 10 included in a TFT substrate according to one embodiment of the present invention.
FIG. 1(b) is an enlarged view showing an area near a channel region Rc of the thin film transistor 10.
Figure 1:
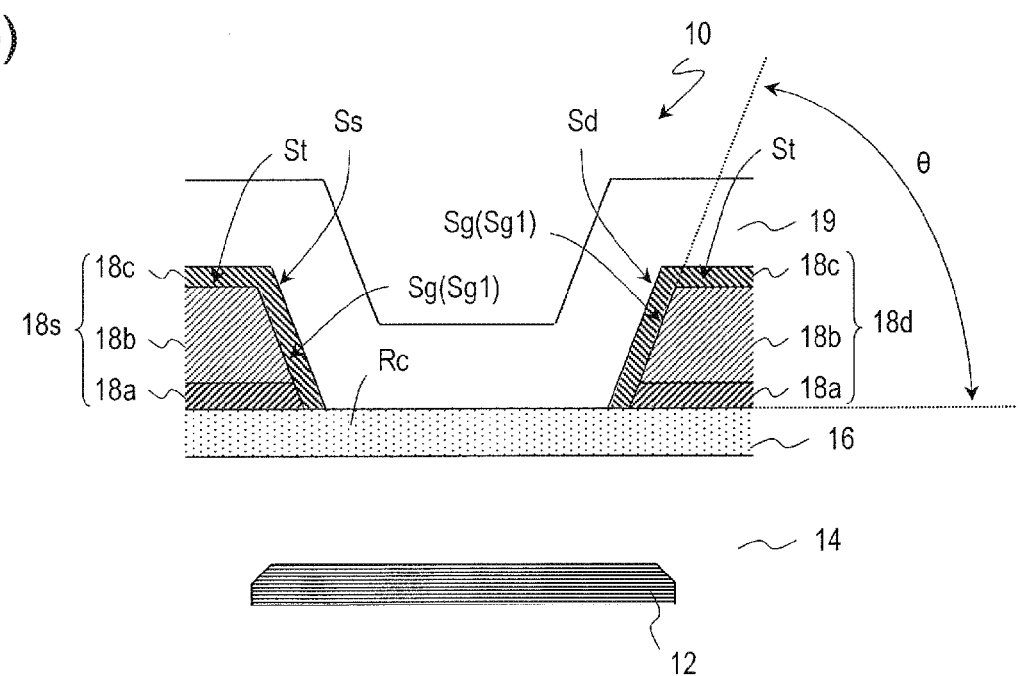

First, with reference to FIGS. 1(a) and 1(b), a structure of a thin film transistor 10 included in a TFT substrate according to one embodiment of the present invention is described. FIG. 1(a) shows a schematic cross-section of the thin film transistor 10, and FIG. 1(b) shows an enlarged view of an area around a channel region Rc of the thin film transistor 10. In the descriptions below, constituting components having practically the same functions are shown with common reference characters, and descriptions thereof may be omitted.

As shown in FIG. 1(a), the thin film transistor 10 is supported by a substrate (typically, a transparent substrate) 11, which is a TFT substrate. The thin film transistor 10 includes a gate electrode 12 provided on the substrate 11, a semiconductor layer 16, a gate-insulating layer 14 provided between the gate electrode 12 and the semiconductor layer 16, and a source electrode 18s and a drain electrode 18d respectively making contact with the semiconductor layer 16. As described later, the source electrode 18s and the drain electrode 18d are formed from the same multilayer film. An interlayer insulating layer 19 is formed so as to cover the thin film transistor 10. FIG. 1(a) omits a pixel electrode.

The semiconductor layer 16 of the thin film transistor 10 contains an oxide semiconductor. In other words, the semiconductor layer 16 is an oxide semiconductor layer.

The thin film transistor 10 shown in FIG. 1(a) has a bottom-gate top-contact structure. In other words, in the example shown, the gate electrode 12 is provided closer to the substrate 11 than the semiconductor layer 16. The source electrode 18s and the drain electrode 18d are respectively provided so as to make contact with a part of the upper surface of the semiconductor layer 16. The source electrode 18s and the drain electrode 18d are electrically connected to a source region Rs and a drain region Rd of the semiconductor layer 16, respectively.

The source region Rs and the drain region Rd are regions of the semiconductor layer 16 that overlap the source electrode 18s and the drain electrode 18d, respectively. Also, the region of the semiconductor layer 16 that is located between the source region Rs and the drain region Rd and overlaps the gate electrode 12 is called the channel region Rc. A channel length L of the thin film transistor 10 is the distance from the edge of the source electrode 18s on the channel region Rc side to the edge of the drain electrode 18d on the channel region Rc side (length shown with arrow L in FIG. 1(a)).

As shown in FIG. 1(a), the source electrode 18s and the drain electrode 18d respectively include: a main layer 18b; a lower layer 18a provided on the substrate 11 side of the main layer 18b (the lower surface side of the main layer 18b); and an upper layer 18c provided on the side of the main layer 18b opposite to the substrate 11 (the upper surface side of the main layer 18b). The source electrode 18s and the drain electrode 18d respectively have a multilayer structure in which the lower layer 18a, the main layer 18b, and the upper layer 18c are layered in this order from the substrate 11 side. The main layer 18b contains Al or Cu. In contrast, the lower layer 18a and the upper layer 18c respectively contain refractory metal (Ti described later, for example).

The upper layer 18c covers an upper surface St of the main layer 18b. In the thin film transistor 10, the upper layer 18c is provided so as to cover not only the upper surface St of the main layer 18b but also a side face Sg of the main layer 18b. More specifically, the upper layer 18c covers the entire side face Sg of the main layer 18b.

As shown in FIGS. 1(a) and 1(b), the side face Sg of the main layer 18b is inclined with respect to the direction normal to the substrate. An angle θ between the side face Sg of the main layer 18b (a side face Sg1 on the channel region Rc side, for example) and the substrate surface (see FIG. 1(b)) is 70°, for example. The upper layer 18c covers the upper surface St of the main layer 18b and the side face Sg of the main layer 18b, which is inclined with respect to the substrate surface. Thus, a side face Ss of the source electrode 18s and a side face Sd of the drain electrode 18d are inclined with respect to the direction normal to the substrate.

Next, the effects of the thin film transistor included in the TFT substrate of the present embodiment are described by comparing with a thin film transistor of a reference example that includes a multilayered source electrode and a multilayered drain electrode.

Figure 2:
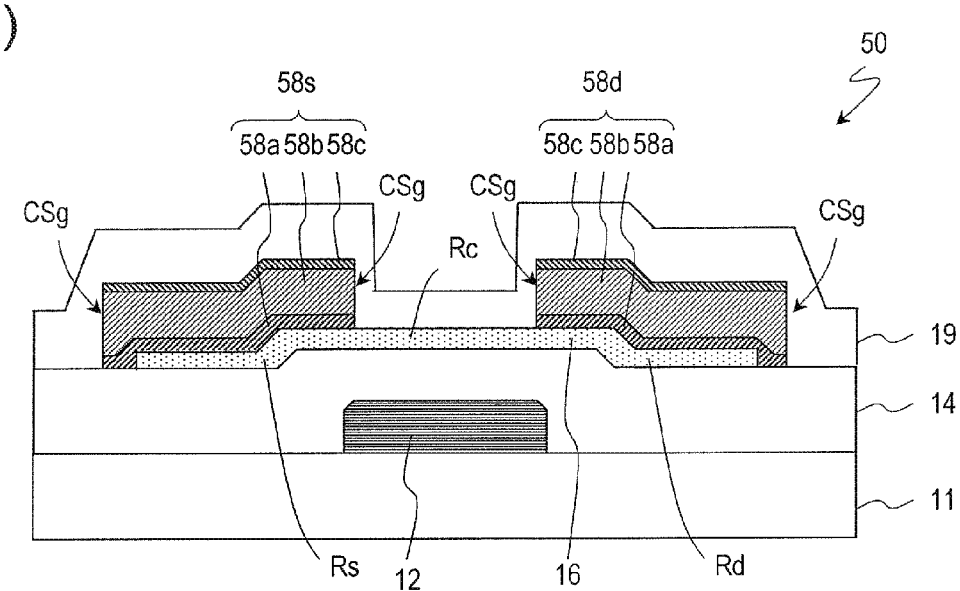
FIG. 2(a) is a schematic cross-sectional view of a thin film transistor 50 of a reference example that includes a source electrode and a drain electrode having a multilayer structure.
FIG. 2(b) is an enlarged view of an area near a channel region Rc of the thin film transistor 50.
Figure 2:
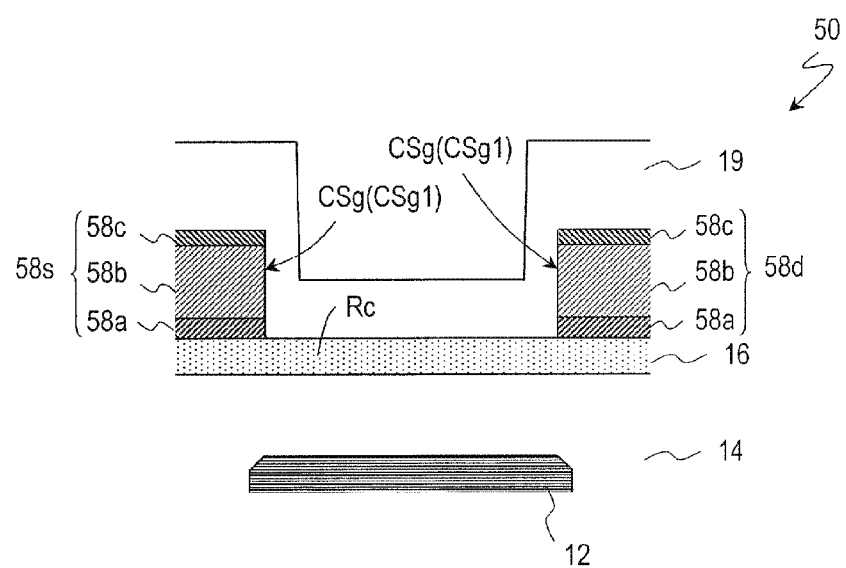

FIG. 2(a) shows a schematic cross-section of a thin film transistor 50 of the reference example, and FIG. 2(b) shows the enlarged area around a channel region Rc of the thin film transistor 50. As shown in FIG. 2(a), a source electrode 58s and a drain electrode 58d of the thin film transistor 50 have a multilayer structure in which a Ti layer 58a, an Al layer 58b, and a Ti layer 58c are layered in that order from a substrate 11 side. The present specification may express the structure of a multilayer film by naming the layers sequentially starting with the film positioned at the top. According to this way of expression, the source electrode 58s and the drain electrode 58d are respectively represented as Ti/Al/Ti.

As shown in FIGS. 2(a) and 2(b), in the thin film transistor 50, a side face CSg of the Al layer 58b is not covered by the Ti layer 58c provided on the upper surface side of the Al layer 58b. This conventional configuration prevents the semiconductor layer 16 from directly making contact with the Al layer 58b because the Ti layer 58a is provided between the semiconductor layer 16 and the Al layer 58b. However, there is a risk that TFT characteristics will become degraded due to the diffusion of Al into the area near the channel region Rc from the side face of the Al layer 58b (a side face CSg1 facing the channel region Rc, for example). Also, increasing the thickness of the source wiring layer to reduce wiring resistance makes steeper the shape of the side face of the source electrode 58s and of the side face of the drain electrode 58d, and a disconnection in the interlayer insulating layer 19 provided on the source wiring layer becomes more likely to occur. If moisture or the like enters from the disconnection, the diffusion of Al becomes markedly accelerated. A similar problem can occur when a Cu layer, instead of the Al layer 58b, is provided between the Ti layer 58a and the Ti layer 58c.

The problem described above can also occur in oxide semiconductor TFTs, which have been gaining popularity recently. Oxide semiconductors are considered sensitive to the effects of the diffusion of Al or Cu, and in particular, when adopting the channel-etch structure, there is a concern that the yield of semiconductor devices will decrease.

As a countermeasure, in the thin film transistor 10 shown in FIGS. 1(a) and 1(b), the side face Sg of the main layer 18b is covered by the upper layer 18c, which contains refractory metal. Thus, the diffusion of Al or Cu into the semiconductor layer 16 from the side face Sg of the main layer 18b can be inhibited. Even when moisture enters through a disconnection that occurs in the interlayer insulating layer 19 covering the thin film transistor 10, the diffusion of Al or Cu into the semiconductor layer 16 from the side face Sg of the main layer 18b can be inhibited, thereby preventing the degradation of TFT characteristics. In this manner, one embodiment of the present invention inhibits the diffusion of Al or Cu into the semiconductor layer and increases the reliability of the TFT substrate.

The effects described above can be achieved by covering, with the upper layer 18c, at least the part of the side face Sg of the main layer 18b that overlaps the semiconductor layer 16. Thus, a configuration in which a part or the entirety of a side face Sg2 of the side face Sg of the main layer 18b that is on the side opposite to the channel region Rc is not covered by the upper layer 18c can also be employed, for example. Yet, by forming the upper layer 18c so as to cover the entirety of the side face Sg of the main layer 18b, the diffusion of Al or Cu into the semiconductor layer 16 can be inhibited more reliably.

In the description above, an example in which the semiconductor layer 16 is an oxide semiconductor layer was shown; however, other semiconductor material may be used as the material for the semiconductor layer 16. Amorphous silicon (a-Si) or microcrystalline silicon may be used as the material for the semiconductor layer 16, for example. Depending on the semiconductor material being used, a contact layer for forming an ohmic junction between a source region Rs and the source electrode 18s and an ohmic junction between a drain region Rd and the drain electrode 18d may be formed. In other words, in addition to the active layer that includes the source region Rs, the drain region Rd, and the channel region Rc, the semiconductor layer 16 may also include the contact layer.

Next, an example of a manufacturing method of a TFT substrate that includes the thin film transistor 10 is described with reference to FIGS. 3(a) to 3(f). FIGS. 3(a) to 3(f) are cross-sectional views used to describe a manufacturing method of a TFT substrate that includes the thin film transistor 10.

First, the substrate 11 is prepared. The substrate 11 can be a glass substrate, a silicon (Si) substrate, a heat resistant plastic substrate (resin substrate), or the like. The material for the plastic substrate (resin substrate) can be polyethylene terephthalate (PET), polyethylene naphthalate (PEN), polyether sulfone (PES), an acrylic resin, polyimide, or the like. Plastic composite material in which a filler (fiber, non-woven fabric, etc.) is mixed with these resin materials may also be used. In this embodiment, the glass substrate is used.

Next, as shown in FIG. 3(a), the gate electrode 12 is formed on the substrate 11. After depositing a conductive film (referred to as the "gate metal film" below) on the substrate 11 by a sputtering method or the like, the gate electrode 12 can be formed by patterning the gate metal film via a photolithography process. Typically, the gate metal film is deposited on almost the entire surface of the substrate 11. A gate metal layer formed from the gate metal film may include a gate bus line formed in integration with the gate electrode 12, a CS electrode, and a CS busline formed in integration with the CS electrode (none shown).

The material for the gate metal film can be a metal such as Al, tungsten (W), Mo, tantalum (Ta), chromium (Cr), Ti, or Cu, or an alloy or a nitride of such metals. Also, the gate metal film may not only be a single layer film made of the material described above but also a multilayer film made of the material described above. In this example, after depositing a TaN film (film thickness: 50 nm) and a W film (film thickness: 370 nm) by sputtering, the gate electrode 12 is formed by patterning the gate metal film via photolithography and dry etching, for example.

Next, as shown in FIG. 3(b), the gate-insulating layer 14 is formed so as to cover the gate electrode 12. The gate-insulating layer 14 can be formed using a CVD (chemical vapor deposition) method, for example. Typically, an insulating film (gate insulating film) for forming the gate-insulating layer 14 is deposited on almost the entire surface of the substrate 11.

The material for the gate-insulating film can be silicon oxide ($SiO_x$), silicon nitride ($SiN_x$), silicon oxynitride ($SiO_xN_y$, x>y), silicon nitride oxide ($SiN_xO_y$, x>y), or the like, for example. The gate-insulating film may be a single layer film or a multilayer film. When the gate-insulating film has two layers of film, to prevent the diffusion of impurities and the like from the substrate 11, for example, it is preferable that the lower layer insulating film be made of silicon nitride ($SiN_x$), silicon nitride oxide ($SiN_xO_y$, x>y), or the like, for example, and that the upper layer insulating film be made of silicon oxide ($SiO_x$), silicon oxynitride ($SiO_xN_y$, x>y), or the like, for example. Mixing a noble gas such as argon (Ar) in the reactant gas enables the deposition of a precise insulating film at a relatively low temperature. A precise insulating film can have the effect of reducing the gate leakage current. Here, the gate-insulating layer 14 is formed using a CVD method to sequentially deposit a SiN film (film thickness: 325 nm) and a $SiO_2$ film (film thickness: 50 nm).

Next, as shown in FIG. 3(c), the island-shaped semiconductor layer 16 is formed on the gate-insulating layer 14. The semiconductor layer 16 can be formed by patterning the semiconductor film via a photolithography process, after depositing a semiconductor film on the gate-insulating layer 14 by sputtering, CVD, or the like. At least a part of the semiconductor layer 16 is provided so as to overlap the gate electrode 12 via the gate-insulating layer 14 when viewed from the direction normal to the substrate 11. Here, after depositing an oxide semiconductor film (film thickness: 30-100 nm) by sputtering, the island-shaped oxide semiconductor layer is formed by patterning the oxide semiconductor film via a photolithography process, for example.

The oxide semiconductor layer contains an In—Ga—Zn—O semiconductor, for example. Here, the In—Ga—Zn—O semiconductor is a ternary oxide including In (indium), Ga (gallium), and Zn (zinc), and there is no special limitation to the ratio (composition ratio) of In, Ga, and Zn. The In—Ga—Zn—O semiconductor includes ratios such as In:Ga:Zn=2:2:1, In:Ga:Zn=1:1:1, and In:Ga:Zn=1:1:2, for example.

In the present specification, the oxide semiconductor layer may be an In—Ga—Zn—O semiconductor that includes In, Ga, and Zn with the ratio In:Ga:Zn=1:1:1, for example.

A TFT having an In—Ga—Zn—O semiconductor layer has high mobility (more than 20 times that of a-Si TFT) and low leakage current (a hundredth of that of a-Si TFT), and therefore can be suitably used as a driver TFT and a pixel TFT. Using a TFT having an In—Ga—Zn—O semiconductor layer makes it possible to significantly reduce the power consumption of a display device.

An In—Ga—Zn—O semiconductor may be amorphous or include crystalline parts. It is preferable that a crystalline In—Ga—Zn—O semiconductor have a c-axis with an orientation that is mostly vertical to the layer surface. Such a crystalline structure of an In—Ga—Zn—O semiconductor is described in Japanese Patent Application Laid-Open Publication No. 2012-134475, for example. All the content described in Japanese Patent Application Laid-Open Publication No. 2012-134475 is incorporated by reference in the present specification.

The oxide semiconductor layer may include other oxide semiconductors instead of an In—Ga—Zn—O semiconductor. The oxide semiconductor layer may include Zn—O semiconductors (ZnO), In—Zn—O semiconductors (IZO (registered trademark)), Zn—Ti—O semiconductors (ZTO), Cd—Ge—O semiconductors, Cd—Pb—O semiconductors, $InGaO_3(ZnO)_5$, magnesium zinc oxide ($Mg_xZn_{1-x}O$), cadmium zinc oxide ($Cd_xZn_{1-x}O$), cadmium oxide (CdO), Mg—Zn—O semiconductors, In—Sn—Zn—O semiconductors ($In_2O_3$—$SnO_2$—ZnO, for example), In—Ga—Sn—O semiconductors, or the like, for example. As Zn—O semiconductors, it is possible to use ZnO that is amorphous, polycrystalline, or microcrystalline (a mix of amorphous and polycrystalline states) doped with one or more impurity elements selected among group 1 elements, group 13 elements, group 14 elements, group 15 elements, group 17 elements, and the like, or ZnO not doped with any impurity elements.

Next, the source wiring layer that includes the source electrode 18s and the drain electrode 18d is formed on the semiconductor layer 16. In this step, first, after a multilayer structure (Al/Ti, for example) consisting of the lower layer 18a and the main layer 18b is formed, this multilayer structure is patterned into a prescribed shape. Thereafter, a conductive film (Ti film, for example) is deposited so as to cover the main layer 18b, and the upper layer 18c is formed by patterning the conductive film. In other words, in the step of forming the source electrode 18s and the drain electrode 18d, patterning is performed twice.

Below, with reference to FIGS. 3(d) to 3(f), the step of forming the source electrode 18s and the drain electrode 18d will be described in greater detail.

First, a lower conductive film is deposited on the semiconductor layer 16. The material for the lower conductive film is refractory metal or an alloy or nitride thereof, for example. Examples of refractory metal include Ti, Mo, W, Ta, and Cr. From the point of view of reducing contact resistance, Ti is preferable among these examples. Here, the lower conductive film is formed by depositing a Ti film (film thickness: 30 nm) by sputtering, for example. Typically, the lower conductive film is deposited almost on the entire surface of the substrate 11.

Conventionally, in an oxide semiconductor TFT, it is known that providing a Ti layer so as to be in contact with the oxide semiconductor layer forms a reaction layer at the interface of the oxide semiconductor layer and the Ti layer and that, as a result, contact resistance can be reduced. In the present specification, the reaction layer and the oxide semiconductor layer can be collectively referred to as the "semiconductor layer."

Next, a middle conductive film is deposited on the lower conductive film. As the material for the middle conductive film, Al, Cu, or an alloy thereof can be used. The middle conductive film is formed by depositing an Al film (film thickness: 300 nm) by sputtering, for example. Typically, the middle conductive film is also deposited on almost the entire surface of the substrate 11.

Next, as shown in FIG. 3(d), the lower layer 18a and the main layer 18b are formed by patterning the lower conductive film and the middle conductive film. In this step, patterning is performed via photolithography or dry etching. A gas mixture containing chlorine ($Cl_2$) and Ar can be used as the etching gas for dry etching, for example.

By suitably controlling the flow rate of $Cl_2$ and Ar, the pressure of the etching gas, and the power of a high-frequency power supply, the main layer 18b having a prescribed tapered shape can be formed. In this step, it is preferable that the angle θ (see FIG. 1(b)) formed by the side face Sg of the main layer 18b and the substrate surface be less than or equal to 70°. By adjusting the angle θ formed by the side face of the main layer 18b and the substrate surface so as to be within the range described above, it becomes possible to cover the side face Sg of the main layer 18b with the upper layer 18c more reliably.

Next, as shown in FIG. 3(e), the upper conductive film 18f is deposited on the main layer 18b. The material for the upper conductive film 18f is the refractory metal described above or an alloy or nitride thereof, for example. The upper conductive film 18f is formed by depositing a Ti film (film thickness: 30 nm) by sputtering, for example. Typically, the upper conductive film 18f is deposited on almost the entire surface of the substrate 11. Thus, the upper surface St and the side face Sg of the main layer 18b are covered by the upper conductive film 18f.

Next, as shown in FIG. 3(f), the upper layer 18c is formed by patterning the upper conductive film 18f. In this step, patterning is performed via photolithography or dry etching. Patterning is performed so as to leave the upper conductive film 18f on the upper surface St of the main layer 18b and on at least part of the side face Sg of the main layer 18b that overlaps the semiconductor layer 16. Patterning in this manner can form the upper layer 18c that covers the upper surface St of the main layer 18b and at least part of the side face Sg of the main layer 18b that overlaps the semiconductor layer 16.

As is clear from FIG. 3(f), the channel region Rc of the semiconductor layer 16 is demarcated by the patterning performed on the upper conductive film 18f. Thus, one embodiment of the present invention has an advantage in that the channel length L of the thin film transistor can be controlled relatively easily.

In the conventional configuration in which conductive films for forming the source wiring layer are merely stacked on each other, the amount of variation in etching shift increases as the thickness of the wiring increases, and the amount of variation in the channel length L increases. In other words, the variation in TFT characteristics increases as the thickness of the wiring increases. In contrast, in one embodiment of the present invention, the upper conductive film 18*f* is deposited after patterning the multilayer film constituted by the lower conductive film and the middle conductive film, and the source electrode 18*s* and the drain electrode 18*d* are formed by patterning the upper conductive film 18*f*. Thus, even when the amount of variation in etching shift increases due to the increase in the thickness of the multilayer film constituted by the lower conductive film and the middle conductive film, the channel length L can be controlled by etching the upper conductive film 18*f*. Thus, one embodiment of the present invention can reduce the variation in TFT characteristics and, in particular, increase the manufacturing yield of TFT substrates that are used in high-resolution display devices.

In this manner, the source electrode 18*s* and the drain electrode 18*d* that respectively include the main layer 18*b* containing Al or Cu, the lower layer 18*a* containing refractory metal provided at the substrate 11 side of the main layer 18*b*, and the upper layer 18*c* containing refractory metal provided at the side of the main layer 18*b* opposite to the substrate 11 can be formed. Here, attention was paid to the multilayer structure of the source electrode 18*s* and the drain electrode 18*d*, and the cross-sectional structures thereof were shown. The source wiring (not shown) included in the source wiring layer can have the same multilayer structure as those of the source electrode 18*s* and the drain electrode 18*d*.

After the source electrode 18*s* and the drain electrode 18*d* are formed, the interlayer insulating layer 19 that covers the thin film transistor is formed (not shown). An insulating film (interlayer insulating film) for forming the interlayer insulating layer 19 can be formed via plasma CVD or sputtering, for example. Typically, the interlayer insulating film is deposited on almost the entire surface of the substrate 11.

As the material for the interlayer insulating film, silicon oxide ($SiO_x$), silicon nitride ($SiN_x$), silicon oxynitride ($Si_xO_yN_y$, x>y), silicon nitride oxide ($SiN_xO_y$, x>y), or the like can be used, for example. The interlayer insulating film may be a single layer film or a multilayer film with two or more layers. Here, a $SiO_2$ film (film thickness: 200-300 nm) is deposited by CVD, for example. Thereafter, a contact hole for connecting the drain electrode 18*d* to a pixel electrode (described later) is formed by etching. This forms the interlayer insulating layer 19. An organic insulating layer made of an organic insulating material may be further formed on the interlayer insulating layer 19.

After the formation of the contact hole, heat treatment is performed on the entire TFT substrate. The temperature of the heat treatment is between 250° C. to 450° C., and the duration of the heat treatment is approximately 1 to 2 hours, for example. Performing the heat treatment can form the reaction layer and reduce contact resistance. Also, as a result of oxidizing the channel region of the oxide semiconductor layer, oxygen loss in the channel region can be reduced, and desired TFT characteristics can be achieved.

Next, the pixel electrode (here, transparent electrode, not shown) is formed on the interlayer insulating layer 19. After depositing a transparent conductive film on the interlayer insulating layer 19 by sputtering or the like, the pixel electrode can be formed by patterning the transparent conductive film via a photolithography process. As the material for the transparent conductive film, metal oxide such as ITO, IZO, or ZnO can be used. Via the process described above, a TFT substrate according to one embodiment of the present invention can be obtained.

The TFT substrate manufactured by the process described above can be used as the TFT substrate for a liquid crystal display device, for example. In that case, an alignment film or the like will be further formed on the pixel electrodes as necessary, and a liquid crystal layer will be provided between the TFT substrate and a separately formed opposite substrate.

Figure 4:
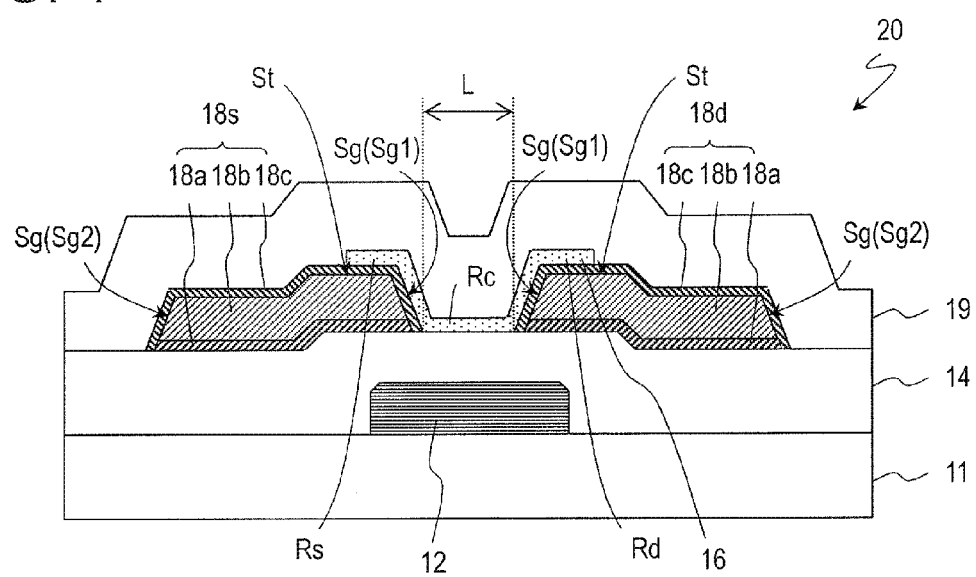
FIG. 4 is a schematic cross-sectional view of a thin film transistor 20 included in a TFT substrate according to another embodiment of the present invention.

Next, the structure of a thin film transistor 20 included in a TFT substrate according to another embodiment of the present invention is described. FIG. 4 shows a schematic cross-section of the thin film transistor 20. The thin film transistor 20 shown in FIG. 4 has a bottom-gate bottom-contact structure. In other words, in the example shown, a gate electrode 12 is provided closer to a substrate 11 than the semiconductor layer 16. A source electrode 18*s* and a drain electrode 18*d* are respectively provided so as to make contact with a part of the lower surface of a semiconductor layer 16.

In the thin film transistor 20, an upper layer 18*c* containing refractory metal covers an upper surface St and a side face Sg of a main layer 18*b* so as to prevent the main layer 18*b* from making direct contact with the semiconductor layer 16 and to inhibit the diffusion of Al or Cu into the semiconductor layer 16 from the side face Sg of the main layer 18*b*. Thus, this configuration can inhibit the deterioration of TFT characteristics due to the diffusion of Al or Cu into the semiconductor layer 16.

Figure 5:
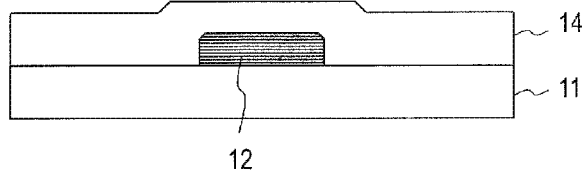
FIGS. 5(a) to 5(e) are cross-sectional views used to describe a manufacturing method of a TFT substrate that includes the thin film transistor 20.
Figure 5:
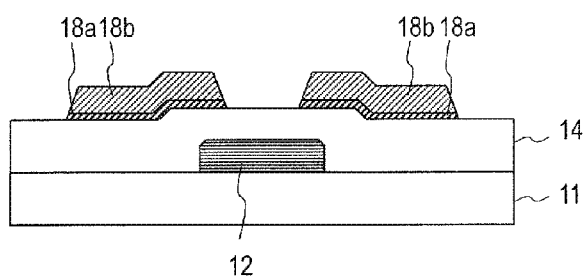
Figure 5:
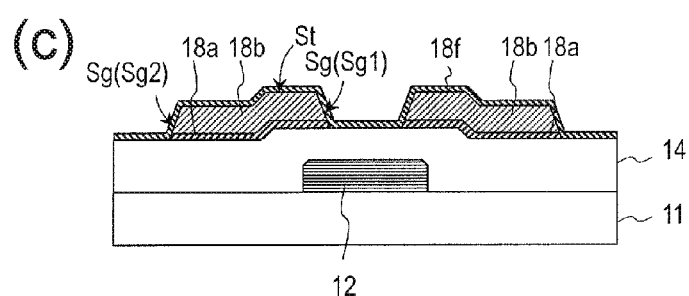
Figure 5:
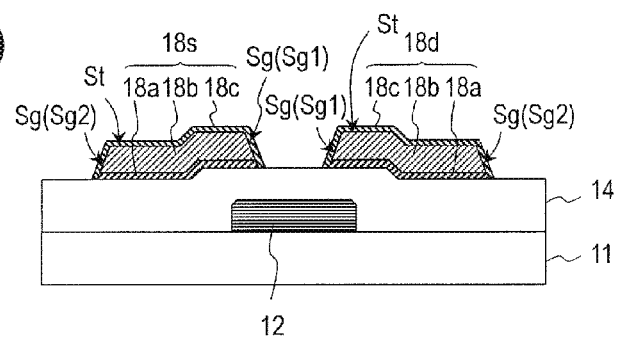
Figure 5:
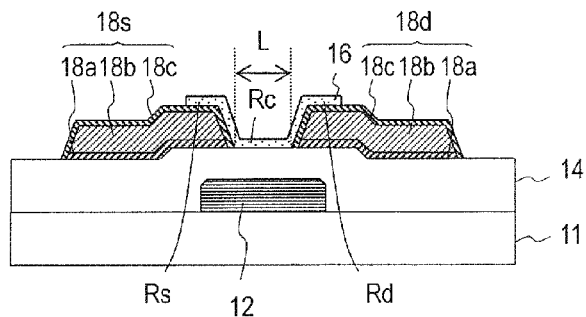

Next, with reference to FIGS. 5(*a*) to 5(*e*), an example of a manufacturing method of a TFT substrate that includes the thin film transistor 20 is described. FIGS. 5(*a*) to 5(*e*) are cross-sectional views used to describe a manufacturing method of a TFT substrate that includes the thin film transistor 20.

Figure 3:
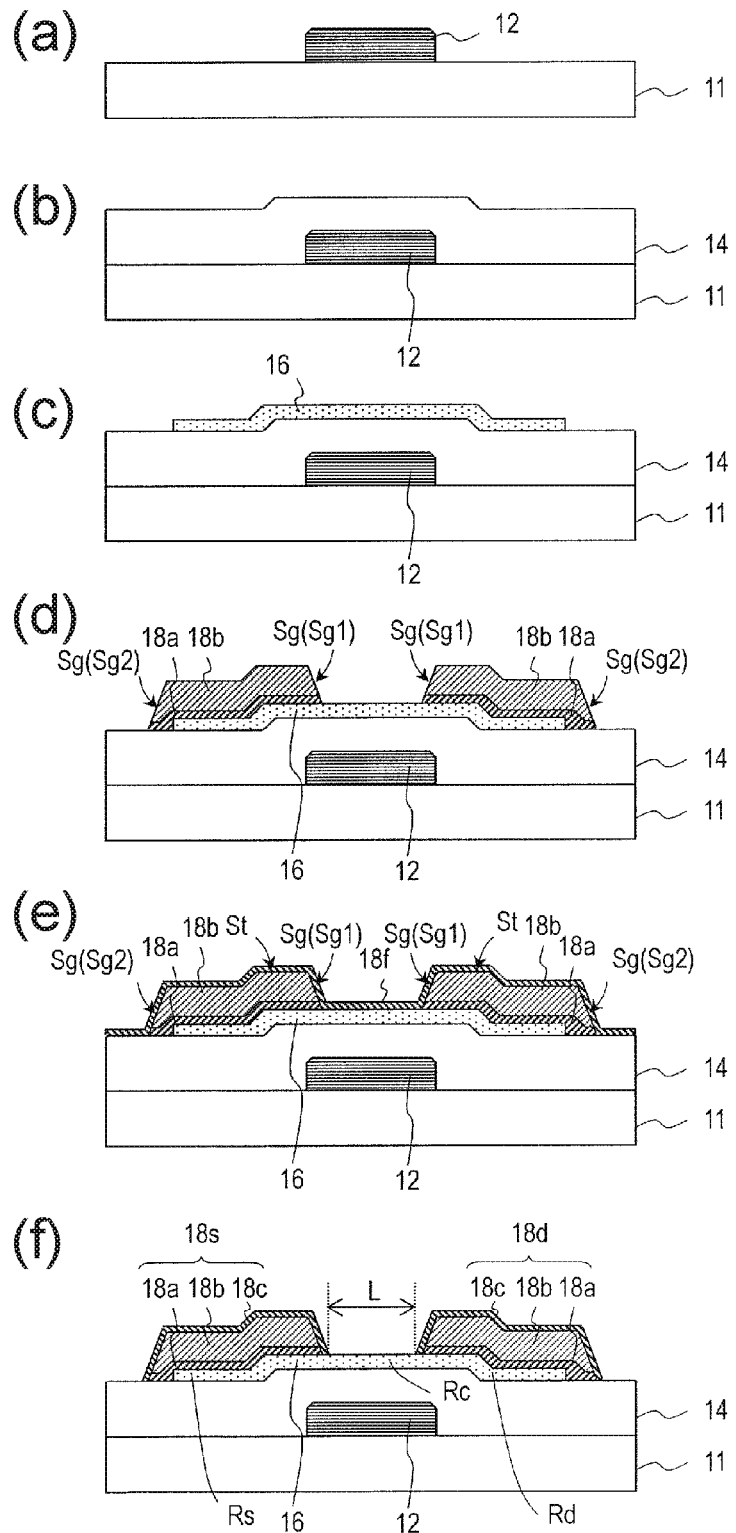
FIGS. 3(a) to 3(f) are cross-sectional views used to describe a manufacturing method of a TFT substrate that includes the thin film transistor 10.

In the manufacturing method of the TFT substrate that includes the thin film transistor 10 described with reference to FIGS. 3(*a*) to 3(*f*), the step of forming the source electrode 18*s* and the drain electrode 18*d* is performed after the step of forming the semiconductor layer 16. In contrast, in the manufacturing method of the TFT substrate that includes the thin film transistor 20, the step of forming the source electrode 18*s* and the drain electrode 18*d* is performed before the step of forming the semiconductor layer 16. Below, the descriptions and the process diagram of parts of the manufacturing method of the TFT substrate including the thin film transistor 20 that are common with those in the manufacturing method of the TFT substrate including the thin film transistor 10 may be omitted.

First, as shown in FIG. 5(*a*), after the gate electrode 12 is formed on the substrate 11, a gate-insulating layer 14 that covers the gate electrode 12 is formed.

Next, the source electrode 18*s* and the drain electrode 18*d* are formed on the gate-insulating layer 14. More specifically, a lower conductive film (Ti film, for example) is deposited on the gate-insulating layer 14. Next, a middle conductive film (Al film, for example) is deposited on the lower conductive film.

Thereafter, as shown in FIG. 5(*b*), a lower layer 18*a* and the main layer 18*b* are formed by patterning the lower conductive film and the middle conductive film. In this step, the main layer 18*b* having a prescribed tapered shape is formed by patterning via photolithography and dry etching.

Next, as shown in FIG. 5(*c*), an upper conductive film (Ti film, for example) 18*f* is deposited on the main layer 18*b*. Typically, the upper conductive film 18*f* is deposited almost on the entire surface of the substrate 11. Thus, the upper conductive film 18*f* covers the upper surface St and the side face Sg of the main layer 18*b*.

Next, as shown in FIG. 5(*d*), the upper layer 18*c* is formed by patterning the upper conductive film 18*f*. In this step, patterning is performed via photolithography and dry etching so as to leave the upper conductive film 18*f* on the upper surface St and the side face Sg of the main layer 18*b*. This process can separate the source electrode 18*s* and the drain electrode 18*d* and demarcate a channel length L of the thin film transistor 20.

Next, as shown in FIG. 5(*e*), the island-shaped semiconductor layer 16 is formed by depositing a semiconductor film (oxide semiconductor film, for example) on the upper layer 18*c* and patterning the semiconductor film. The island-shaped semiconductor layer 16 is provided such that a part of the lower surface thereof makes contact with the source electrode 18*s* and the drain electrode 18*d*, respectively. In this step, at least a part of the semiconductor layer 16 is provided so as to overlap the gate electrode 12 via the gate-insulating layer 14 when viewed from the direction normal to the substrate 11. The patterning of the upper conductive film 18*f* in the step of forming the upper layer 18*c* may be performed so as to leave the upper conductive film 18*f* on the upper surface St of the main layer 18*b* and at least a part of the side face Sg of the main layer that overlaps the semiconductor layer 16.

After the semiconductor layer 16 is formed, the interlayer insulating layer 19 that covers the thin film transistor is formed (not shown). Thereafter, a pixel electrode (here, transparent electrode; not shown) is formed on the interlayer insulating layer 19. Via the process described above, a TFT substrate that includes the thin film transistor 20 can be obtained.

Figure 6:
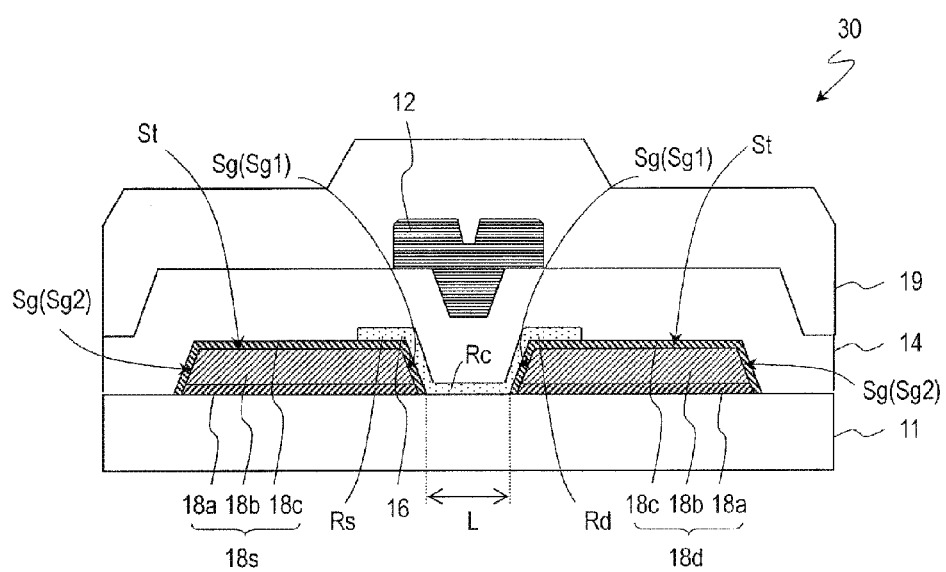
FIG. 6 is a schematic cross-sectional view of a thin film transistor 30 included in a TFT substrate according to an additional embodiment of the present invention.

Next, the structure of a thin film transistor 30 included in a TFT substrate according to an additional embodiment of the present invention is described. FIG. 6 shows a schematic cross-section of the thin film transistor 30. The thin film transistor 30 shown in FIG. 6 has a top-gate bottom-contact structure. In other words, in the example shown, a semiconductor layer 16 is provided closer to a substrate 11 than a gate electrode 12. A source electrode 18*s* and a drain electrode 18*d* are respectively provided so as to make contact with a part of the lower surface of the semiconductor layer 16. The configuration of the thin film transistor 30 can inhibit the degradation of TFT characteristics due to the diffusion of Al or Cu into the semiconductor layer 16 from a side face Sg of a main layer 18*b* because an upper layer 18*c* containing refractory metal covers an upper surface St and a side face Sg of the main layer 18*b*.

Figure 7:
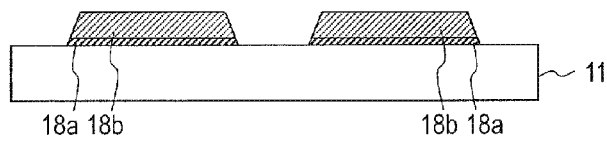
FIGS. 7(a) to 7(f) are cross-sectional views used to describe a manufacturing method of a TFT substrate that includes the thin film transistor 30.
Figure 7:
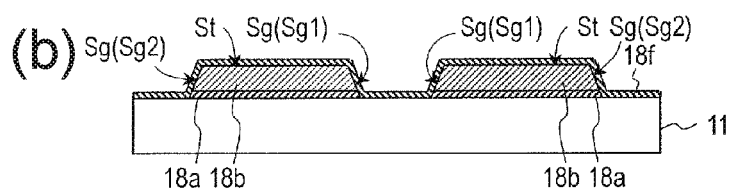
Figure 7:
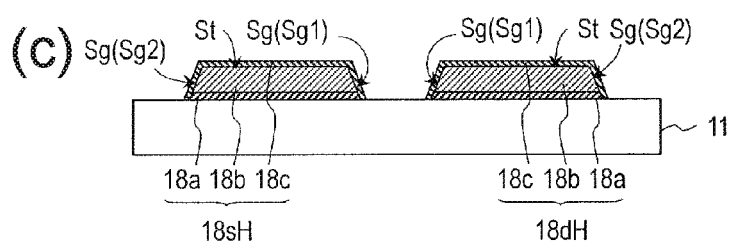
Figure 7:
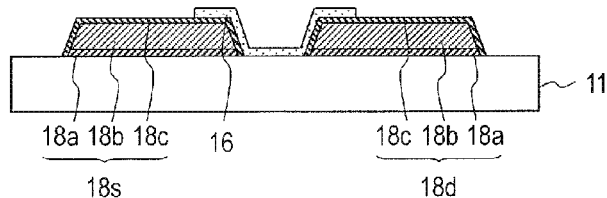
Figure 7:
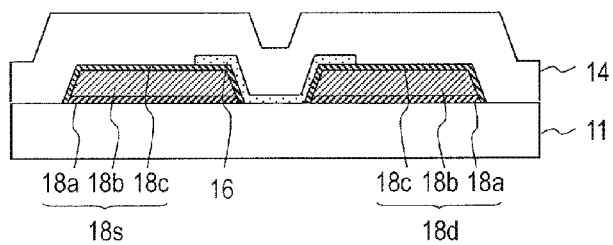
Figure 7:
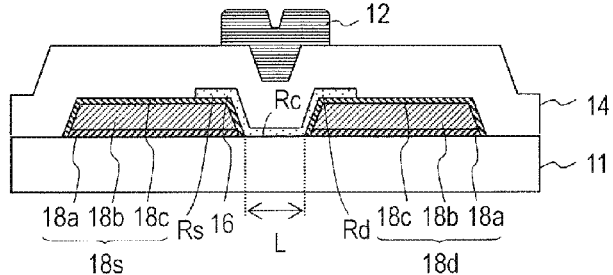

Below, with reference to FIGS. 7(*a*) to 7(*f*), an example of a manufacturing method of a TFT substrate that includes the thin film transistor 30 is described. FIGS. 7(*a*) to 7(*f*) are cross-sectional views used to describe a manufacturing method of a TFT substrate that includes the thin film transistor 30.

In the manufacturing method of the TFT substrate that includes the thin film transistor 10 described with reference to FIGS. 3(*a*) to 3(*f*) and the manufacturing method of the TFT substrate that includes the thin film transistor 20 described with reference to FIGS. 5(*a*) to 5(*e*), the step of forming the source electrode 18*s* and the drain electrode 18*d* is performed after the step of forming the gate electrode 12. In contrast, in the manufacturing method of the TFT substrate that includes the thin film transistor 30, the step of forming the source electrode 18*s* and the drain electrode 18*d* is performed before the step of forming the gate electrode 12. Below, the descriptions and the method drawing of parts of the manufacturing method of the TFT substrate that includes the thin film transistor 30 that are common with those in the manufacturing method of the TFT substrate that includes the thin film transistor 10 and the manufacturing method of the TFT substrate that includes the thin film transistor 20 may be omitted.

First, the source electrode 18*s* and the drain electrode 18*d* are formed on the substrate 11. More specifically, as shown in FIG. 7(*a*), a lower conductive film (Ti film, for example) and a middle conductive film (Al film, for example) are sequentially deposited on the substrate 11, and patterning is performed on the lower conductive film and the middle conductive film so as to form a lower layer 18*a* and the main layer 18*b*. In this step, the main layer 18*b* having a prescribed tapered shape is formed by patterning via photolithography and dry etching.

Next, as shown in FIG. 7(*b*), the upper conductive film (Ti film, for example) 18*f* is deposited on the main layer 18*b*. In this step, the upper conductive film 18*f* covers the top surface St and the side face Sg of the main layer 18*b*.

Next, as shown in FIG. 7(*c*), the upper layer 18*c* is formed by patterning the upper conductive film 18*f*. In this step, patterning is performed via photolithography and dry etching so as to leave the upper conductive film 18*f* on the upper surface St and the side face Sg of the main layer 18*b*. This step can form the source electrode 18*s* and the drain electrode 18*d* on the substrate 11.

Next, as shown in FIG. 7(*d*), the island-shaped semiconductor layer 16 is formed by depositing a semiconductor film (oxide semiconductor film, for example) on the upper layer 18*c* and patterning the semiconductor film. Next, as shown in FIG. 7(*e*), the gate-insulating layer 14 that covers the source electrode 18*s*, the drain electrode 18*d*, and the semiconductor layer 16 is formed. Next, as shown in FIG. 7(*f*), the gate electrode 12 is formed on the gate-insulating layer 14. In particular, after depositing the gate metal film on the gate-insulating layer 14, the gate electrode 12 is formed by patterning the gate metal film via a photolithography process.

After the gate electrode 12 is formed, the interlayer insulating layer 19 that covers the thin film transistor is formed (not shown). Thereafter, a contact hole that connects the drain electrode 18*d* to a pixel electrode (described later) is formed in the interlayer insulating layer 19 and the gate-insulating layer 14, and the pixel electrode (here, transparent electrode; not shown) is formed on the interlayer insulating layer 19. Via the process described above, a TFT substrate that includes the thin film transistor 30 can be obtained.

The descriptions above showed examples in which the device structure of a thin film transistor was a bottom-gate top-contact structure, a bottom-gate bottom-contact structure, or a top-gate bottom-contact structure; however, the device structure of the thin film transistor may be a top-gate top-contact structure.

Also, the descriptions above used as an example a case in which the lower layer 18*a* and the upper layer 18*c* consisted of a single layer; however, the lower layer 18*a* and the upper layer 18*c* may have a multilayer structure. The lower layer 18*a* and the upper layer 18*c* may respectively include at least one layer containing refractory metal. Such modification examples will be described below. The multilayer structure of the lower layer 18*a* and the upper layer 18*c* to be described below can be applied to any one of the thin film transistor 10, the thin film transistor 20, and the thin film transistor 30 described above. Here, a modification example of the thin film transistor 10 that has a bottom-gate top-contact structure is described.

Figure 8:
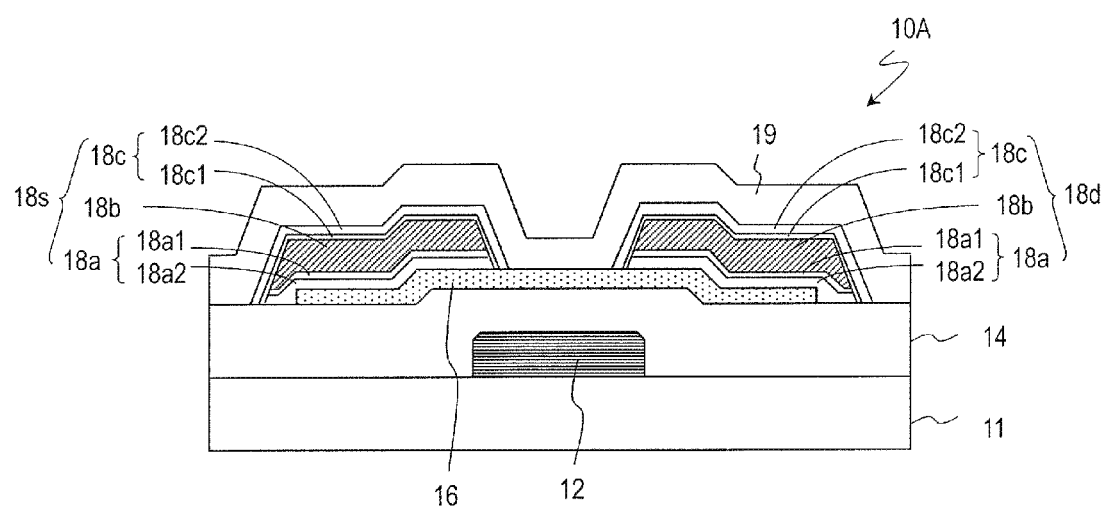
FIG. 8 is a schematic cross-sectional view of a thin film transistor 10A, which is a modification example of the thin film transistor 10.
Figure 9:
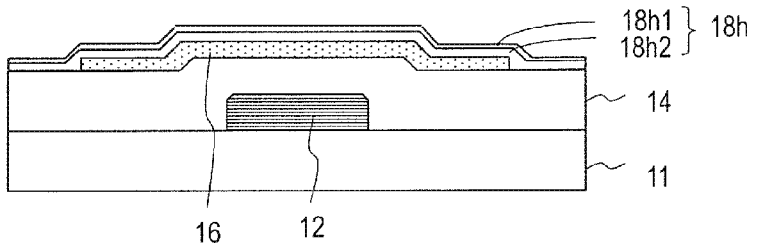
FIGS. 9(a) to 9(e) are cross-sectional views used to describe a manufacturing method of a TFT substrate that includes the thin film transistor 10A.
Figure 9:
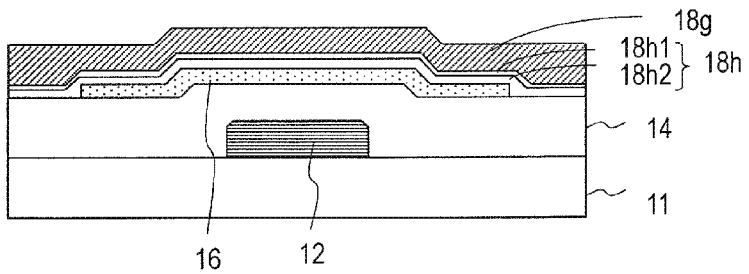
Figure 9:
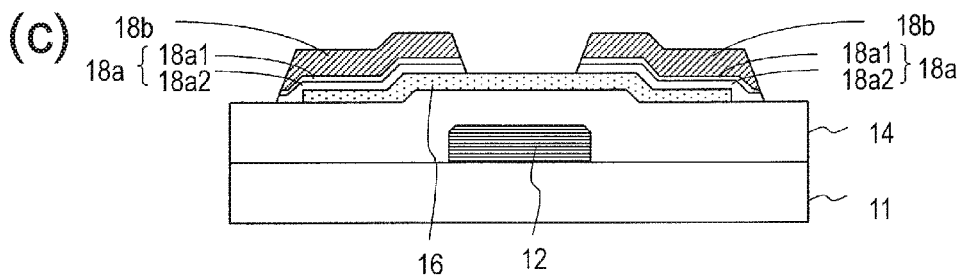
Figure 9:
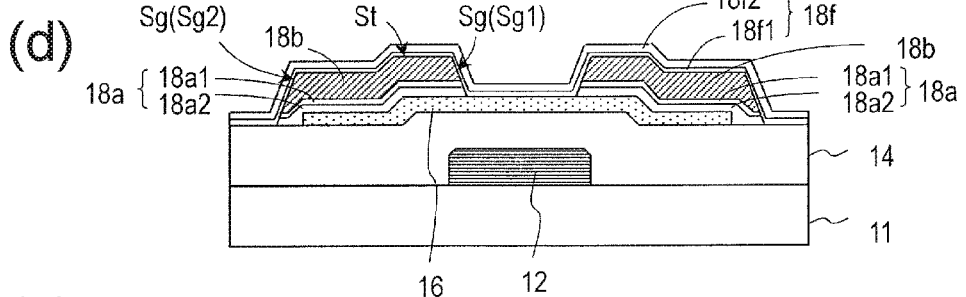
Figure 9:
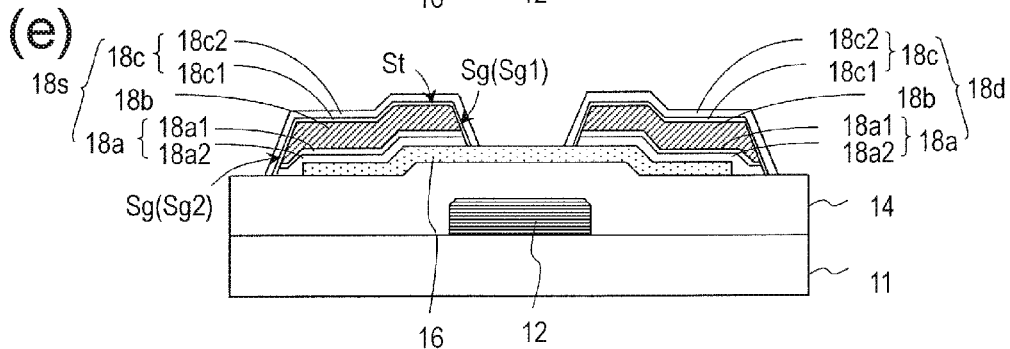

FIG. 8 shows a schematic cross-section of a thin film transistor 10A, which is a modification example of the thin film transistor 10. The lower layer 18*a* and the upper layer 18c included in the source electrode 18s and the drain electrode 18d of the thin film transistor 10A respectively has a two-layer multilayer structure. Here, the main layer 18b is a layer containing Al or Cu (referred to as "the first metal" below), and the lower layer 18a and the upper layer 18c respectively include a metal nitride layer made of a nitride of Ti or Mo (referred to as "the second metal" below) and a metal layer made of the second metal.

More particularly, the lower layer 18a includes, from the main layer 18b side, a lower metal nitride layer 18a1 made of a nitride of the second metal and a lower metal layer 18a2 made of the second metal in that order. Also, the upper layer 18c includes, from the main layer 18b side, an upper metal nitride layer 18c1 made of a nitride of the second metal and a lower metal layer 18c2 made of the second metal in that order. When Al is used as the first metal and Ti is used as the second metal, the lower layer 18a and the upper layer 18c respectively include, from the main layer 18b side, a titanium nitride (TiN) layer and a Ti layer in that order. In the present specification, the lower metal layer and the upper metal layer may be collectively referred to as "the metal layer."

It becomes possible to suppress the degradation of TFT characteristics (increase in ON resistance) by providing a nitride layer of the second metal (a TiN layer or a molybdenum nitride (MoN) layer) between a metal layer made of the second metal (Ti or Mo) and the main layer 18b. The reason for this is the following.

If some type of heat treatment is performed after the formation of the source electrode and the drain electrode having a structure in which an Al layer (or Cu layer) is sandwiched between Ti layers (Ti/Al/Ti or Ti/Cu/Ti), there is a concern that the metals will become diffuse into each other between the Al layer (or Cu layer) and the Ti layers and that the purity of the Al layer (or Cu layer) will lower, thereby increasing resistance. If heat treatment (between 250° C. to 450° C., for example) for reducing oxygen loss in the oxide semiconductor layer is performed when using the oxide semiconductor for the semiconductor layer, there is a concern that the resistance of the Al layer (or Cu layer) increases, for example. The same problem remains when using a Mo layer, instead of the Ti layer.

Providing a nitride layer of the second metal (here, the lower metal nitride layer 18a1 and the upper metal nitride layer 18c1) between the metal layer made of the second metal (here, the lower metal layer 18a2 and the upper metal layer 18c2) and the main layer 18b suppresses the mutual diffusion of the metals between the main layer 18b and the metal layer. As a result, the degradation of TFT characteristics due to an increase in the resistance of the source electrode 18s and the drain electrode 18d or the source wiring can be suppressed.

In the example shown, the lower metal layer 18a2 is in contact with the semiconductor layer 16. In this step, when an oxide semiconductor is used as the material for the semiconductor layer 16, and Ti is used as the second metal, the Ti layer as the lower metal layer 18a2 is in contact with the oxide semiconductor layer. In this configuration, as described above, contact resistance is lowered as a result of a reaction layer being formed at the interface of the oxide semiconductor layer and the Ti layer. In this manner, providing the lower metal layer 18a2 so as to be in contact with the oxide semiconductor layer can provide the advantage of reducing contact resistance. When using a bottom-contact structure, providing the upper metal layer 18c2 so as to make contact with the semiconductor layer 16 can similarly reduce contact resistance.

As described later in greater detail, the source electrode 18s and the drain electrode 18d may include other conductive layers, in addition to the layers described above. Even in that case, if there is a metal nitride layer between the metal layer and the main layer 18b, the effects described above can be achieved. The lower metal nitride layer 18a1 may be in contact with the lower surface of the main layer 18b, and the upper metal nitride layer 18c1 may be in contact with the upper surface of the main layer 18b. If the main layer 18b is in contact with the metal nitride layer (here, the lower metal nitride layer 18a1 or the upper metal nitride layer 18c1), it becomes possible to suppress the mutual diffusion between the metal layer and the main layer 18b more effectively.

With reference to FIGS. 9(a) to 9(e), an example of a manufacturing method of a TFT substrate that includes the thin film transistor 10A is described. FIGS. 9(a) to 9(e) are cross-sectional views used to describe a manufacturing method of a TFT substrate that includes the thin film transistor 10A. Other than the fact that the lower conductive film for forming the lower layer 18a and the upper conductive film for forming the upper layer 18c are multilayer films, the manufacturing method of the TFT substrate that includes the thin film transistor 10A is the same as the manufacturing method of the TFT substrate that includes the thin film transistor 10 described with reference to FIGS. 3(a) to 3(f). Thus, the step of forming the source electrode 18s and the drain electrode 18d are described here, and the descriptions and the process drawing of other steps are omitted.

As shown in FIG. 9(a), after forming the semiconductor layer 16, the lower metal film 18h2 made of the second metal and the lower metal nitride film 18h1 made of a nitride of the second metal are sequentially deposited on the semiconductor layer 16. This forms the lower conductive film 18h that has a layer containing refractory metal. In this step, the lower conductive film 18h is formed by sequentially depositing a Ti film and a TiN film by sputtering, for example. Typically, the lower conductive film 18h is deposited almost on the entire surface of the substrate 11.

It is preferable that the thickness of the lower metal nitride film 18h1 be set thinner than the thickness of the lower metal film 18h2. It is more preferable that the thickness be set to less than half the thickness of the lower metal film 18h2. Restraining the thickness of the lower metal nitride film 18h1 in this manner can moderate the film stress of the deposited film deposited on the side wall of a chamber in a film-forming device (PVD (physical vapor deposition) device, for example) and suppress the generation of particles due to the peeling of the film. When sequentially depositing the Ti film and the TiN film, the thickness of the Ti film is set between 50 nm and 200 nm, for example, and the thickness of the TiN film is set between 5 nm and 50 nm, for example. If the thickness of the TiN film is greater than or equal to 5 nm, the diffusion of the metals between the Ti film and the Al film (or Cu film) as the middle conductive film 18g (described later) can be inhibited more effectively. If the thickness of the TiN film is less than or equal to 50 nm, the problem of the peeling of the film described above can be inhibited. When using a Mo film and a MoN film, instead of the Ti film and the TiN film, respectively, the thickness range of the Mo film and the thickness range of the MoN film may be the same as the thickness range of the Ti film and the thickness range of the TiN film, respectively.

Next, as shown in FIG. 9(b), the middle conductive film 18g is deposited on the multilayer film (the lower conductive film 18h) constituted by the lower metal film 18h2 and the lower metal nitride film 18h1. The thickness of the middle conductive film is between 100 nm and 400 nm, for example. Here, the middle conductive film 18g is formed by depositing an Al film by sputtering, for example. Typically, the middle conductive film 18g is deposited on almost the entire surface of the substrate 11.

Next, as shown in FIG. 9(c), the lower layer 18a and the main layer 18b are formed by patterning the multilayer film constituted by the lower conductive film 18h and the middle conductive film 18g. In this step, the main layer 18b having a prescribed tapered shape is formed by patterning via photolithography and dry etching.

Next, as shown in FIG. 9(d), the upper metal nitride film 18f1 made of a nitride of the second metal and the upper metal film 18f2 made of the second metal are sequentially deposited on the main layer 18b. This forms the upper conductive film 18f that has a layer containing refractory metal on the main layer 18b. In this step, the upper conductive film 18f is formed by sequentially depositing a TiN film and a Ti film by sputtering, for example. Typically, the upper metal nitride film 18f1 and the upper metal film 18f2 are deposited on almost the entire surface of the substrate 11. Thus, the multilayer film (the upper conductive film 18O constituted by the upper metal nitride film 18f1 and the upper metal film 18f2 covers the upper surface St and the side face Sg of the main layer 18b.

The thickness range of the upper metal nitride film 18f1 and the thickness range of the upper metal film 18f2 may be the same as the thickness range of the lower metal nitride film 18h1 and the thickness range of the lower metal film 18h2, respectively. In a manner similar to the case of the lower conductive film 18h, it is preferable that the thickness of the upper metal nitride film 18f1 be set thinner than the thickness of the upper metal film 18f2. The thickness of the source wiring layer is between 50 nm and 500 nm, for example.

Next, as shown in FIG. 9(e), the upper layer 18c is formed by pattering the upper conductive film 18f. In this step, patterning is performed via photolithography and dry etching so as to leave the upper conductive film 18f on the upper surface St of the main layer 18b and at least part of the side face Sg of the main layer 18b that overlaps the semiconductor layer 16.

Thereafter, by forming the interlayer insulating layer 19 (not shown), a pixel electrode, or the like, a TFT substrate that includes the thin film transistor 10A can be obtained.

Figure 10:
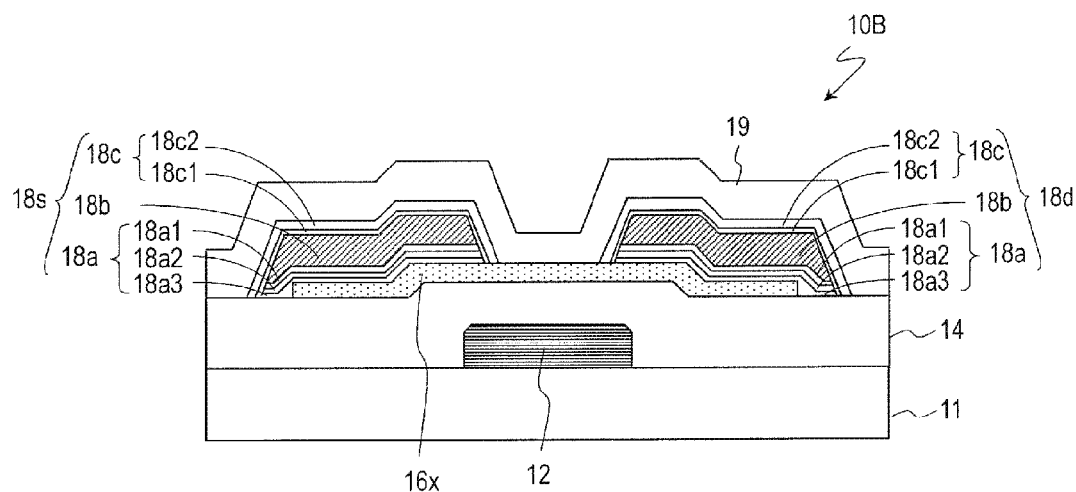
FIG. 10 is a schematic cross-sectional view of a thin film transistor 10B, which is another modification example of the thin film transistor 10.

FIG. 10 shows a schematic cross-section of an additional modification example of the thin film transistor 10. A thin film transistor 10B shown in FIG. 10 is an oxide semiconductor TFT that includes an oxide semiconductor layer 16x.

A lower layer 18a of a source electrode 18s and the drain electrode 18d may further include another metal nitride layer made of a nitride of the second metal. In the configuration shown in FIG. 10 as an example, a metal nitride layer 18a3 is further provided between the oxide semiconductor layer 16x and the lower metal layer 18a2 included in the lower layer 18a. As shown in the figure, the metal nitride layer 18a3 is provided so as to make contact with the oxide semiconductor layer 16x. In the configuration shown in FIG. 10 as an example, the lower layer 18a of the source electrode 18s and the drain electrode 18d of the thin film transistor 10B has a TiN/Ti/TiN three-layer structure, for example.

As described above, it is known that providing a Ti layer in an oxide semiconductor TFT so as to be in contact with the oxide semiconductor layer can lower contact resistance. However, in this configuration, if heat treatment (higher than or equal to 200° C., for example) is performed for some purpose after forming the source electrode and the drain electrode, there is a concern that a redox reaction will occur between the oxide semiconductor and Ti at the portion where the oxide semiconductor layer makes contact with the Ti layer and that the TFT characteristics will vary. In particular, there is a concern that the threshold value shifts significantly toward the negative.

As shown in FIG. 10, by providing the TiN layer (the metal nitride layer 18a3) between the Ti layer (the lower metal layer 18a2) and the oxide semiconductor layer 16x so as to make contact with the oxide semiconductor layer 16x, it becomes possible to suppress the redox reaction between Ti and the oxide semiconductor and to suppress the variation in the TFT threshold value due to the oxygen loss in the oxide semiconductor layer 16x. Thus, desired TFT characteristics can be achieved more reliably. In the configuration in which the TiN layer is provided so as to be in contact with the oxide semiconductor layer, the reaction layer described above is more difficult to be formed. However, contact resistance can be reduced by other methods such as making contact area larger, for example.

The same effects can be achieved by using Mo instead of Ti. The lower layer 18a may have a MoN/Mo/MoN three-layer structure, and the lower most MoN layer may be provided so as to be in contact with the oxide semiconductor layer 16x, for example.

The lower layer 18a of the source electrode 18s and the lower layer 18a of the drain electrode 18d may include additional conductive layers besides those described above. Even in that case, if there is a metal nitride layer (TiN layer or MoN layer) made of a nitride of the second metal between the metal layer (Ti layer or Mo layer) made of the second metal and the oxide semiconductor layer 16x, the effects described above can be achieved. When a bottom-contact structure is adopted, if the upper layer 18c of the source electrode 18s and the drain electrode 18d further include a metal nitride layer on the side opposite to the main layer 18b of the upper metal layer 18c2, and if the metal nitride layer is in contact with the oxide semiconductor layer 16x, the effects described above can be achieved.

A manufacturing method of a TFT substrate that includes the thin film transistor 10B is the same as the manufacturing method of a TFT substrate that includes the thin film transistor 10A described with reference to FIGS. 9(a) to 9(e), except for the fact that the multilayer film used to form the lower layer 18a is different. In short, another metal nitride film made of a nitride of the second metal should be deposited on the semiconductor layer 16 before sequentially depositing the lower metal film 18h2 made of the second metal and the lower metal nitride film 18h1 made of a nitride of the second metal.

Figure 11:
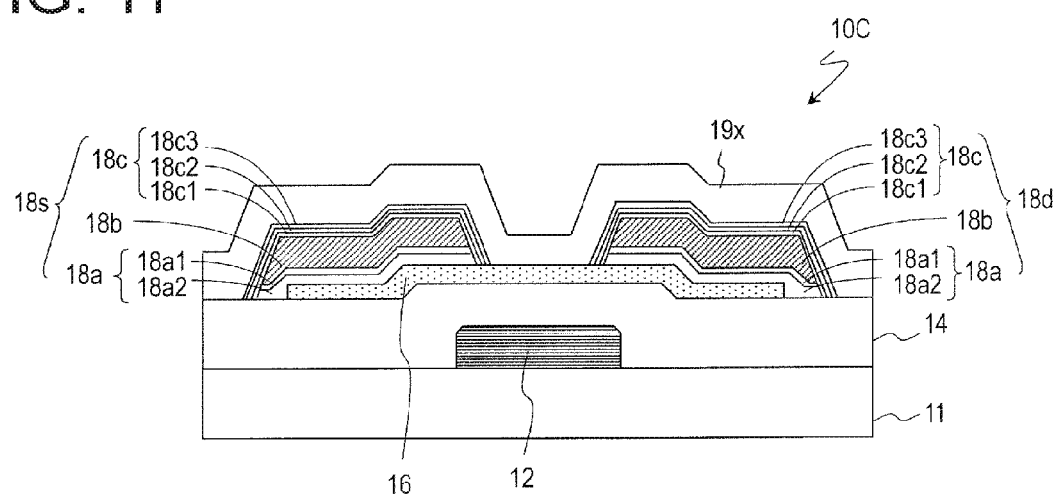
FIG. 11 is a schematic cross-sectional view of a thin film transistor 10C, which is an additional modification example of the thin film transistor 10.

FIG. 11 shows a schematic cross-section of an additional modification example of the thin film transistor 10. As shown in FIG. 11, an upper layer 18c of a source electrode 18s and a drain electrode 18d may further include another metal nitride layer made of a nitride of the second metal. In a configuration shown in FIG. 11 as an example, a metal nitride layer 18c3 is further provided between an interlayer insulating layer 19x and an upper metal layer 18c2 included in the upper layer 18c. As shown in the figure, the metal nitride layer 18c3 is provided so as to make contact with the interlayer insulating layer 19x. The interlayer insulating layer 19x is an oxide insulating layer (here, a silicon oxide ($SiO_x$) layer). In the configuration shown in FIG. 11 as an example, the upper layer 18c of the source electrode 18s and the drain electrode 18d of the thin film transistor 10C have a TiN/Ti/TiN three-layer structure, for example.

In the configuration in which the Ti layer is in contact with the interlayer insulating layer (oxide insulating layer), if a heat treatment (higher than or equal to 200° C., for example) is performed for some purpose after forming the interlayer insulating layer, there is a possibility that the surface of the Ti layer will become oxidized due to the redox reaction between the Ti layer and the interlayer insulating layer and that the adhesion of the source electrode and the drain electrode to the interlayer insulating layer will be reduced. When the adhesion of the source electrode and the drain electrode to the interlayer insulating layer is reduced, there is a concern that the interlayer insulating layer will become separated and that manufacturing yield will decrease.

As shown in FIG. 11, providing the TiN layer (the metal nitride layer 18c3) between the Ti layer (the upper metal layer 18c2) and the interlayer insulating layer 19x so as to be in contact with the interlayer insulating layer 19x can suppress the redox reaction between Ti and the interlayer insulating layer 19x (oxide insulating layer). This configuration can inhibit the reduction in the adhesion of the source electrode 18s and the drain electrode 18d to the interlayer insulating layer 19x and increase manufacturing yield. The same effects can be achieved by using Mo instead of Ti. The upper layer 18c may have a MoN/Mo/MoN three-layer structure, and the upper most MoN layer may be provided so as to be in contact with the interlayer insulating layer 19x, for example.

The upper layer 18c of the source electrode 18s and the upper layer 18c of the drain electrode 18d may include additional conductive layers besides those described above. Even in that case, if a metal nitride layer (TiN layer or MoN layer) made of a nitride of the second metal is provided between the metal layer (Ti layer or Mo layer) made of the second metal and the interlayer insulating layer 19x, the effects described above can be achieved.

A manufacturing method of a TFT substrate that includes the thin film transistor 10C is the same as the manufacturing method of a TFT substrate that includes the thin film transistor 10A described with reference to FIGS. 9(a) to 9(e), except for the fact that the multilayer film used to form the upper layer 18c is different. In short, the upper metal nitride film 18f1 made of a nitride of the second metal and the upper metal film 18f2 made of the second metal may be sequentially deposited on the main layer 18b, and additionally, another metal nitride film made of a nitride of the second metal may be sequentially deposited on the main layer.

Figure 12:
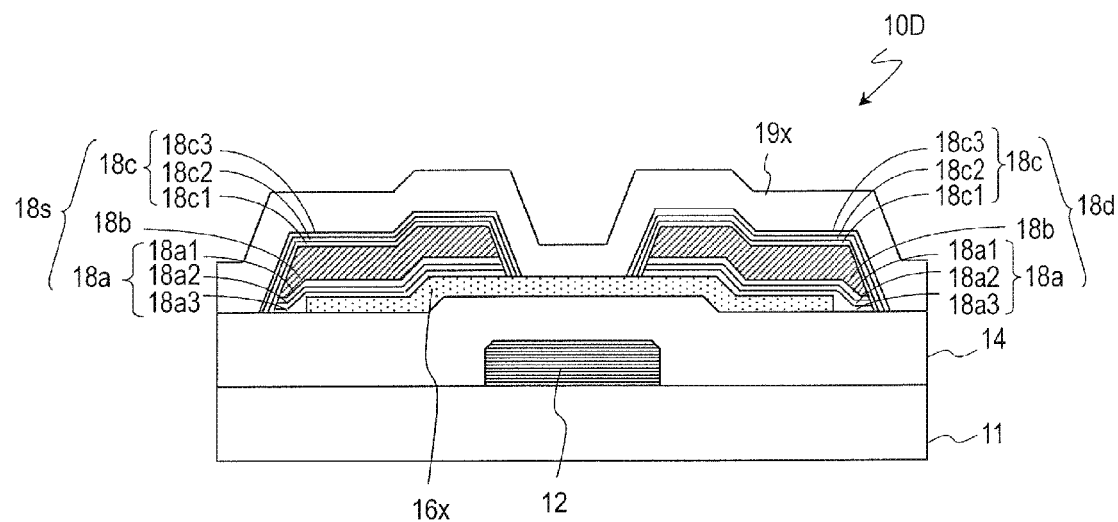
FIG. 12 is a schematic cross-sectional view of a thin film transistor 10D, which is another modification example of the thin film transistor 10.

The respective configurations described above may be combined together. FIG. 12 shows a schematic cross-section of a thin film transistor 10D, which is an additional modification example of the thin film transistor 10. Similar to the thin film transistor 10B shown in FIG. 10, the thin film transistor 10D shown in FIG. 12 is an oxide semiconductor TFT that includes an oxide semiconductor layer 16x.

As shown in FIG. 12, a lower layer 18a and an upper layer 18c of a source electrode 18s and a drain electrode 18d may respectively include a TiN/Ti/TiN three-layer structure. Instead of the TiN/Ti/TiN three-layer structure, a MoN/Mo/MoN three-layer structure may be adopted. In this manner, the lower layer 18a of the source electrode 18s and the drain electrode 18d may further include a metal nitride layer 18a3 (also referred to as the lower metal nitride surface layer 18a3) provided between a lower metal layer 18a2 and an oxide semiconductor layer 16x. The upper layer 18c of the source electrode 18s and the drain electrode 18d may further include the metal nitride layer 18c3 (also referred to as the upper metal nitride surface layer 18c3) provided between the upper metal layer 18c2 and the interlayer insulating layer 19x (oxide insulating layer). In the configuration shown in FIG. 12 as an example, the lower metal nitride surface layer 18a3 is in contact with the oxide semiconductor layer 16x, and the upper metal nitride surface layer 18c3 is in contact with the interlayer insulating layer 19x.

The lower layer 18a of the thin film transistor 10D can be formed in a manner similar to the lower layer 18a of the thin film transistor 10B shown in FIG. 10, and the upper layer 18c of the thin film transistor 10D can be formed in a manner similar to the upper layer 18c of the thin film transistor 10C shown in FIG. 11. Thus, the descriptions and the process drawing of the manufacturing method are omitted.

Figure 13:
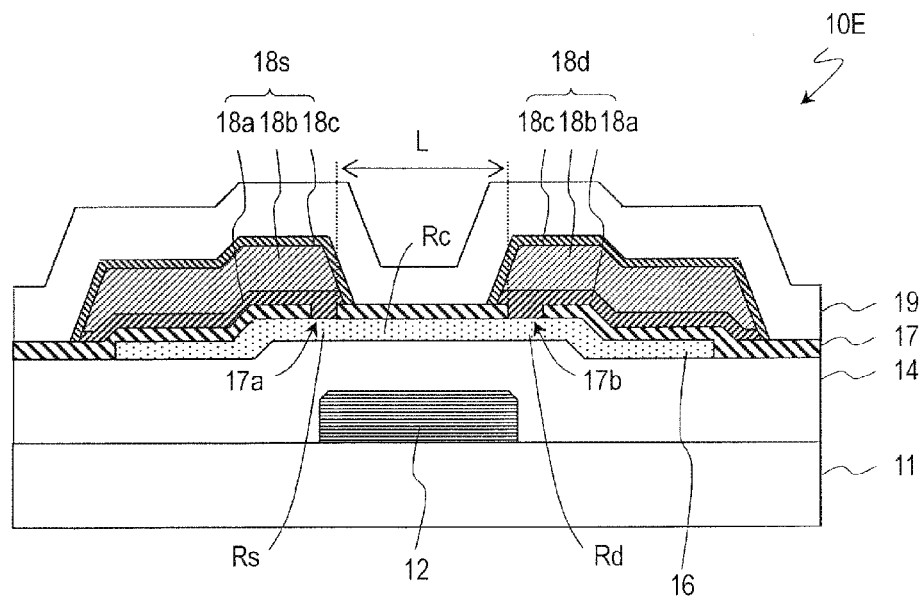
FIG. 13 is a schematic cross-sectional view of a thin film transistor 10E, which is an additional modification example of the thin film transistor 10.

FIG. 13 shows a schematic cross-section of an additional modification example of the thin film transistor 10. A thin film transistor 10E shown in FIG. 13 includes an etch stop layer 17 that covers a channel region Rc of a semiconductor layer 16. Forming the etch stop layer 17 can reduce process damage that occurs in the semiconductor layer 16.

In the example shown, the etch stop layer 17 is formed so as to cover the semiconductor layer 16 and a gate-insulating layer 14. The etch stop layer 17 includes therein a first opening 17a that exposes a source region Rs and a second opening 17b that exposes a drain region Rd, and the source electrode 18s and the drain electrode 18d are connected to the semiconductor layer 16 via the first opening 17a and the second opening 17b, respectively. In this example, a channel length L is the distance between the first opening 17a and the second opening 17b (see FIG. 13).

The etch stop layer 17 can be formed, after forming the semiconductor layer 16, by depositing a protective film on the semiconductor layer 16 before forming the source electrode 18s and the drain electrode 18d and patterning this protective film. More particularly, after forming the semiconductor layer 16, the protective film (thickness: between 30 nm and 200 nm, for example) is deposited on the semiconductor layer 16 via CVD, for example. Examples of the protective film include a silicon oxide film ($SiO_2$ film, for example), a silicon nitride film, a silicon oxynitride film, or a multilayer film constituted by these films. Next, the etch stop layer 17 can be formed by performing patterning via a photolithography process. The patterning is performed such that the part of the semiconductor layer 16 that is to become the channel region Rc is covered by the etch stop layer 17. This forms the etch stop layer 17 that covers the part of the semiconductor layer 16 that is to become the channel region Rc.

When using an oxide semiconductor as the material for the semiconductor layer 16, it is preferable that the etch stop layer 17 includes an oxide layer such as a silicon oxide layer. By including an oxide layer in the etch stop layer 17, when oxygen loss occurs in the oxide semiconductor, it becomes possible to restore the lost oxygen with the oxygen contained in the oxide layer and to reduce oxygen loss in the oxide semiconductor.

Figure 14:
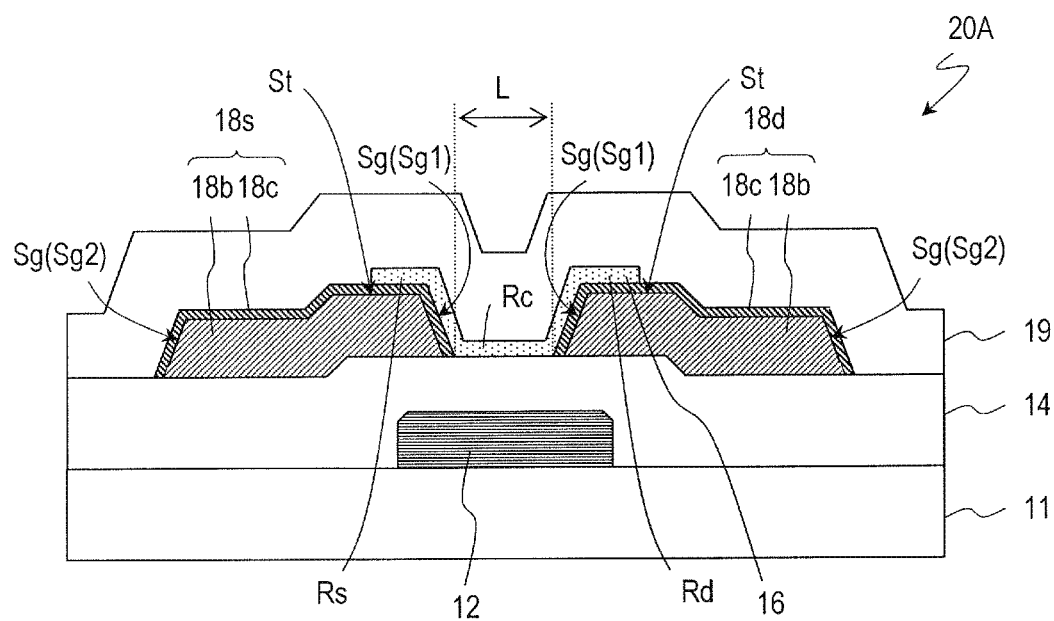
FIG. 14 is a schematic cross-sectional view of a thin film transistor 20A, which is a modification example of the thin film transistor 20.

When a bottom-contact structure is adopted, the lower layer 18a described above can be omitted. FIG. 14 shows a schematic cross-section of a thin film transistor 20A, which is a modification example of the thin film transistor 20. In the example shown, an upper surface St and a side face Sg of a main layer 18b is covered by an upper layer 18c containing refractory metal, and the upper layer 18c is provided between the main layer 18b and a semiconductor layer 16. In other words, in the thin film transistor 20A, the main layer 18b is not in direct contact with the semiconductor layer 16, and the diffusion of Al or Cu into the semiconductor layer 16 from the upper surface St and the side face Sg of the main layer 18b is inhibited. Thus, this configuration can inhibit the deterioration of TFT characteristics due to the diffusion of Al or Cu into the semiconductor layer 16.

In a similar manner, even in the case of adopting a top-gate bottom-contact structure (see FIG. 6, for example), the lower layer 18a can be omitted. A multilayer structure shown in FIGS. 8 to 12 may be suitably applied to the upper layer 18c.

A manufacturing method of a TFT substrate that includes the thin film transistor 20A is the same as the manufacturing method of a TFT substrate that includes the thin film transistor 20 described with reference to FIGS. 5(a) to 5(e), except for the fact that the step of forming the lower layer (lower conductive film) is omitted. Thus, the descriptions and the process drawing of the manufacturing method are omitted.

INDUSTRIAL APPLICABILITY

The embodiments of the present invention can be applied to a wide range of devices provided with a thin film transistor such as circuit substrates such as active matrix substrates, display devices such as liquid crystal display devices, organic electroluminescent (EL) display devices and inorganic electroluminescence display devices, imaging devices such as image sensor devices, and electronic devices such as image input devices and fingerprint reading devices. In particular, the embodiments of the present invention can be suitably applied to high-resolution liquid crystal display devices or the like.

DESCRIPTION OF REFERENCE CHARACTERS 10, 20, 30 thin film transistor (TFT)
11 substrate
12 gate electrode
14 gate-insulating layer
16 semiconductor layer
18s source electrode
18d drain electrode
18a lower layer
18b main layer
18c upper layer
19 interlayer insulating layer

What is claimed is:

1. A semiconductor device, comprising:
a substrate and a thin film transistor supported on the substrate,
wherein the thin film transistor includes:
  a gate electrode;
  a semiconductor layer;
  a gate insulating layer between the gate electrode and the semiconductor layer; and
  a source electrode and a drain electrode each contacting the semiconductor layer, and
wherein the source electrode and the drain electrode each include:
  a main layer including aluminum or copper;
  a lower layer underneath the main layer, having a first layer including a refractory metal; and
  an upper layer above the main layer, having a second layer including a refractory metal, and
wherein the upper layer is provided so as to cover a top of the main layer and, among side faces of the main layer, at least a side face that is located at a position corresponding to the semiconductor layer, and
wherein the upper layer is in contact with the semiconductor layer.

2. The semiconductor device according to claim 1, wherein the source electrode and the drain electrode are each provided so as to contact a portion of an upper surface of the semiconductor layer.

3. The semiconductor device according to claim 1, wherein the source electrode and the drain electrode are each provided so as to contact a portion of a lower surface of the semiconductor layer.

4. The semiconductor device according to claim 1, wherein the gate electrode is arranged closer to the substrate than the semiconductor layer.

5. The semiconductor device according to claim 1, wherein the refractory metal is titanium, molybdenum, tungsten, tantalum, or chromium.

6. The semiconductor device according to claim 1, wherein the thin film transistor further includes an etch stop layer that covers a channel region of the semiconductor layer.

7. The semiconductor device according to claim 1, wherein the semiconductor layer includes an oxide semiconductor.

8. The semiconductor device according to claim 7, wherein the oxide semiconductor includes an In—Ga—Zn—O semiconductor.

9. The semiconductor device according to claim 8, wherein the In—Ga—Zn—O semiconductor includes crystalline parts.

10. The semiconductor device according to claim 1, wherein the semiconductor device is an active matrix substrate.

11. A display device, comprising:
the semiconductor device according to claim 10.

12. A method of manufacturing a semiconductor device, comprising:
preparing a substrate; and
forming a thin film transistor on the substrate, said thin film transistor including a semiconductor layer, a gate electrode, a source electrode, a drain electrode, and a gate-insulating layer,
wherein the step of forming the thin film transistor includes forming the source electrode and the drain electrode which each include a main layer including aluminum or copper an upper layer above the main layer, having a first layer including a refractory metal, and a lower layer underneath the main layer, having a second layer including a refractory metal, and
wherein, in the step of forming the source electrode and the drain electrode, the upper layer is formed so as to cover a top of the main layer and, among side faces of the main layer, at least a side face that is located at a position corresponding to the semiconductor layer, and the upper layer is in contact with the semiconductor layer.

13. The method of manufacturing the semiconductor device according to claim 12, wherein the step of forming the source electrode and the drain electrode includes forming an upper conductive film having the first layer including the refractory metal on the main layer and thereafter patterning the upper conductive film so as to form the upper layer.

14. The method of manufacturing the semiconductor device according to claim 13, wherein the step of forming the source electrode and the drain electrode further includes sequentially forming a lower conductive film having a second layer including a refractory metal and a middle conductive film including aluminum or copper and thereafter patterning the lower conductive film and the middle conductive film so as to form the lower layer and the main layer, said lower layer being underneath the main layer, having the second layer including the refractory metal.

\* \* \* \* \*